(12) United States Patent
Doche

(10) Patent No.: US 6,176,023 B1
(45) Date of Patent: Jan. 23, 2001

(54) DEVICE FOR TRANSPORTING FLAT OBJECTS AND PROCESS FOR TRANSFERRING SAID OBJECTS BETWEEN SAID DEVICE AND A PROCESSING MACHINE

(75) Inventor: Claude Doche, Claix (FR)

(73) Assignee: Commissariat a l'Energie Atomique, Paris (FR)

( * ) Notice: Under 35 U.S.C. 154(b), the term of this patent shall be extended for 0 days.

(21) Appl. No.: 09/155,746

(22) PCT Filed: Apr. 2, 1997

(86) PCT No.: PCT/FR97/00587

§ 371 Date: Jan. 4, 1999

§ 102(e) Date: Jan. 4, 1999

(87) PCT Pub. No.: WO97/38439

PCT Pub. Date: Oct. 16, 1997

(30) Foreign Application Priority Data

Apr. 3, 1996 (FR) .................................................. 96 04173

(51) Int. Cl.⁷ ...................................................... F26B 3/00
(52) U.S. Cl. ................................. 34/451; 34/467; 34/508; 34/559; 34/565; 34/92; 34/87; 34/107; 34/202; 34/210
(58) Field of Search ................................. 34/92, 87, 107, 34/192, 195, 202, 209, 210, 217, 218, 232, 451, 461, 463, 464–467, 507, 508, 516, 558, 559, 565, 573

(56) References Cited

U.S. PATENT DOCUMENTS

| | | | |
|---|---|---|---|
| 4,682,927 | * | 7/1987 | Southworth et al. ................. 414/217 |
| 5,177,878 | * | 1/1993 | Visser ........................................ 34/92 |
| 5,295,522 | * | 3/1994 | DeAngelis et al. ..................... 141/98 |
| 5,320,218 | * | 6/1994 | Yamashita et al. ................ 206/213.1 |
| 5,346,518 | * | 9/1994 | Baseman et al. ....................... 55/267 |
| 5,351,415 | * | 10/1994 | Brooks et al. ........................... 34/389 |
| 5,363,867 | * | 11/1994 | Kawano et al. ..................... 134/95.2 |
| 5,377,476 | | 1/1995 | Böhmer et al. ........................ 53/255 |
| 5,382,127 | * | 1/1995 | Garric et al. ........................... 414/217 |
| 5,388,945 | * | 2/1995 | Garric et al. ........................... 414/217 |
| 5,390,785 | * | 2/1995 | Garric et al. ....................... 206/213.1 |
| 5,411,358 | * | 5/1995 | Garric et al. ........................... 414/277 |
| 5,501,564 | * | 3/1996 | Doche .................................... 414/331 |
| 5,509,772 | * | 4/1996 | Doche .................................... 414/217 |
| 5,538,390 | * | 7/1996 | Salzman ................................ 414/786 |
| 5,544,421 | * | 8/1996 | Thompson et al. ...................... 34/58 |
| 5,547,328 | * | 8/1996 | Bonora et al. ........................ 414/217 |
| 5,549,205 | | 8/1996 | Doche .................................... 206/710 |
| 5,570,987 | * | 11/1996 | McKenna ............................. 414/416 |
| 5,572,802 | * | 11/1996 | Alpenfels et al. ...................... 34/192 |
| 5,611,685 | * | 3/1997 | Nakajima et al. .................... 432/205 |
| 5,621,982 | * | 4/1997 | Yamashita et al. ..................... 34/203 |
| 5,630,690 | * | 5/1997 | Salzman ................................ 414/217 |
| 5,756,157 | * | 5/1998 | Kannan et al. ..................... 427/374.1 |
| 5,810,537 | * | 9/1998 | Briner et al. .......................... 414/217 |

FOREIGN PATENT DOCUMENTS

| | | |
|---|---|---|
| 0 582 018 A1 | 2/1994 | (EP) . |
| 0 593 366 A1 | 4/1994 | (EP) . |
| 0 591 085 A1 | 6/1994 | (EP) . |
| WO 92/02950 | 2/1992 | (WO) . |

* cited by examiner

Primary Examiner—Denise L. Ferensic
Assistant Examiner—Andrea M Joyce
(74) Attorney, Agent, or Firm—Anderson, Kill & Olick P.C.

(57) ABSTRACT

The present invention relates to a device and process for transporting flat objects confined in a specific atmosphere. The device comprises at least one assembly provided with several thin, flat cells (31) that open onto a lateral face (33) of said assembly with the cells arranged in parallel and linked by the same ventilation system. Each cell is constructed to receive a flat object (10) and is closed by an independent door (33). The cells are arranged in tandem and the device includes assembly means for interlocking an upper cell to an adjacent lower cell in each successive pair and in a complementary arrangement.

20 Claims, 25 Drawing Sheets

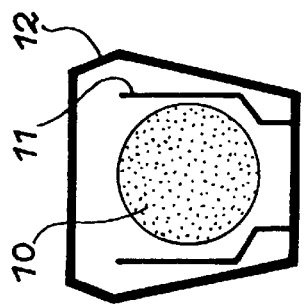
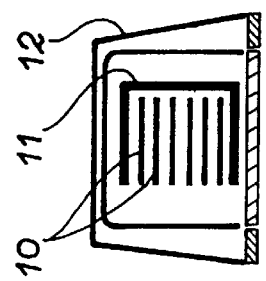
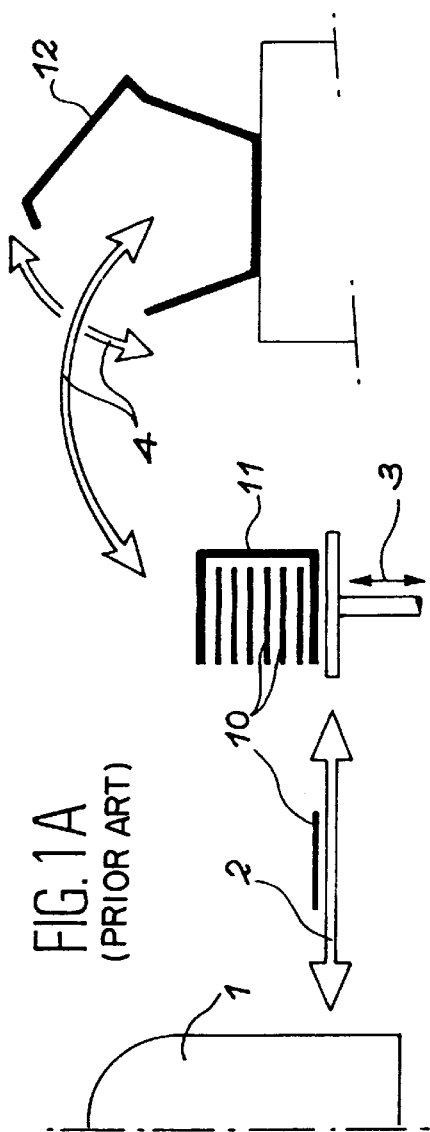
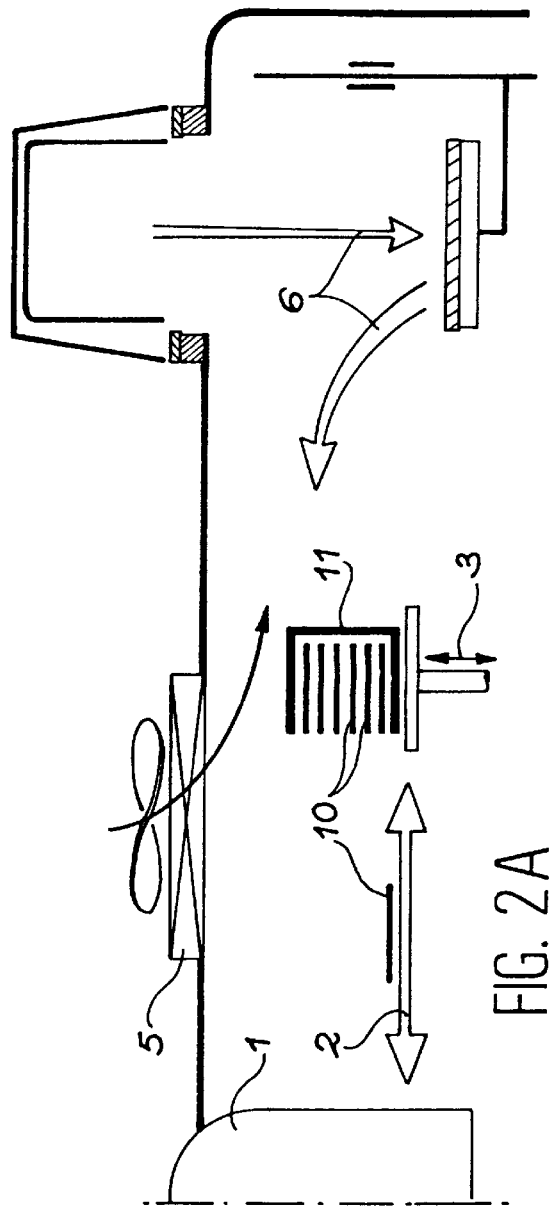

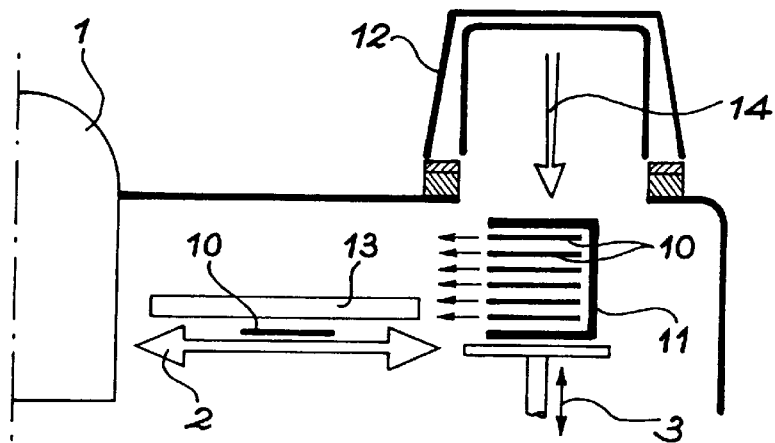
FIG. 3A
(PRIOR ART)
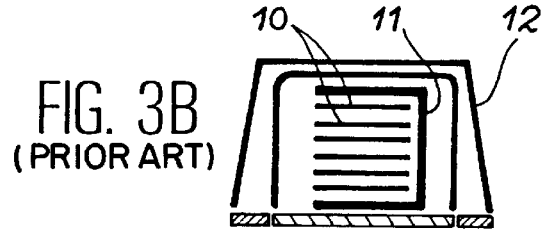
FIG. 3B
(PRIOR ART)
FIG. 4
(PRIOR ART)
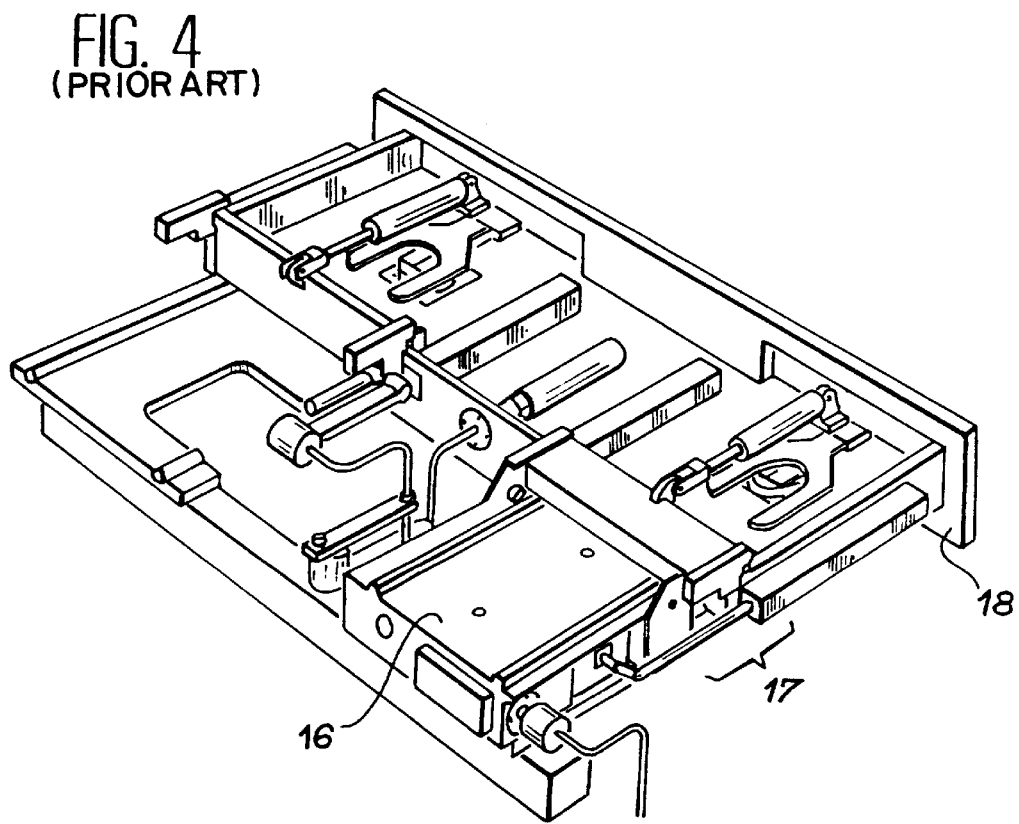

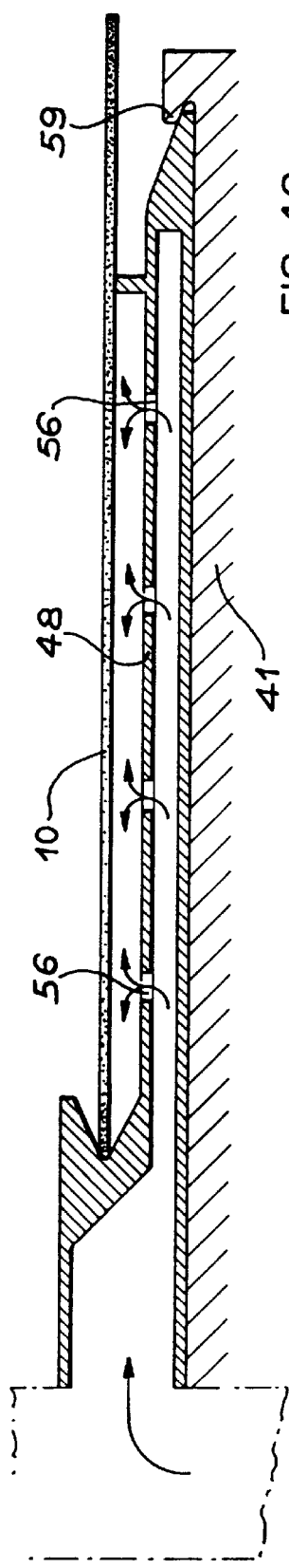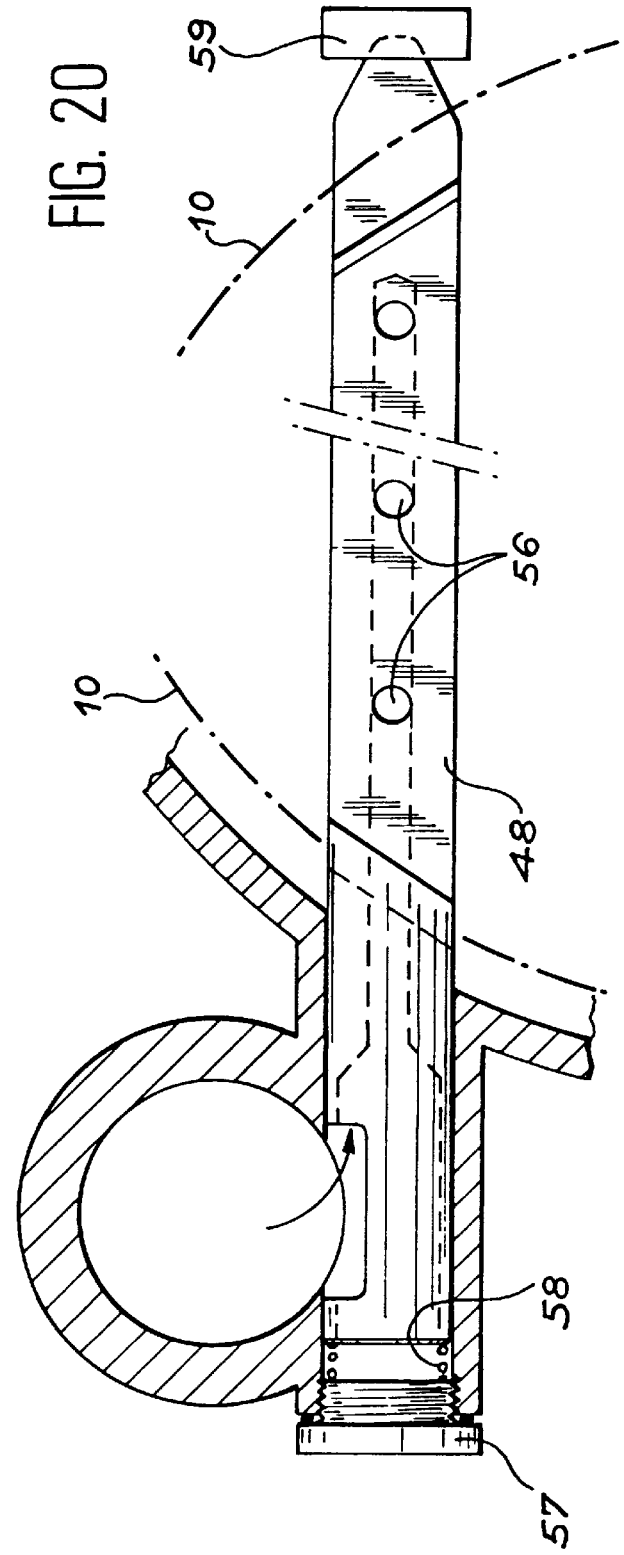

DEVICE FOR TRANSPORTING FLAT OBJECTS AND PROCESS FOR TRANSFERRING SAID OBJECTS BETWEEN SAID DEVICE AND A PROCESSING MACHINE

TECHNICAL FIELD

The invention relates to a device for transporting flat objects, called cassettes or, and a process for transferring these objects between said device and a processing machine thereby guaranteeing a specific environment around the object, without any interruption of the specifications of the environment even when the object is transferred to the process machine.

STATE OF PRIOR ART

The invention relates to the production of flat objects in an ultraclean medium. Production of this kind conventionally uses clean room technology consisting of the global treatment of the atmosphere in which these objects are produced, handled and stored. In food processing, pharmaceutical and microelectronic industries, in particular, many objects are thus produced in a clean room atmosphere in order to avoid risks of contamination.

In the microelectronic industry, contamination is particularly dreaded during the production of components that require very fine etchings and very thin layers, for example flat screens (LCD), and especially during the production of semiconductor devices such as microprocessors or static or dynamic memories, etc. where the integration density is very high.

To simplify this description, the example that will be used throughout this document will be the microelectronic industry, and more particularly, the case of the processing of semiconductor, for example silicon. Indeed, the production of electronic circuits on semiconductor wafers, circular ones for example, requires that said wafers be processed, handled and stored in an ultraclean atmosphere, i.e. surrounded by an ultraclean and/or ultrapure gas such as very clean air or nitrogen.

There are two major types of contamination. They are contamination of particulate origin and contamination of physico-chemical origin or molecular contamination.

Contamination of particulate origin is due to a physical deposit of particles on the manufactured product, which is likely to generate physical phenomena. In the field of microelectronics, such particles on semiconductor wafers can lead to short circuits or electric power-cuts which can lead to falls in output.

Contamination of physico-chemical or molecular origin comes mainly from the air in the clean room, which is particularly rich in volatile carbon components.

These contaminants pass through the filtering system. They are also often generated in the clean room by filters, filter seals, plastic surfaces and also in the vicinity of silicon wafers (baskets and plastic transportation boxes).

Even though the relation between the presence of molecular contaminants and the loss of output is still difficult to establish, it is known that these species can be chemically absorbed at the surface of the silicon wafer. New chemical bonds are revealed by thermal processing and become real defects which affect output. These contaminants may result from the processes themselves and are conveyed by the silicon wafer itself, which will contaminate all the surfaces near the wafer.

Currently, several solutions can be used to avoid particulate contamination.

A first solution consists in subjecting the premises where the semiconductor wafers are handled to an ultraclean atmosphere, i.e. a controlled atmosphere.

The monitoring of the object's environment consists, therefore, in protecting it from all the sources of contamination originating mainly from operators and production machines. This protection is carried out by creating as laminar a flow of air as possible, in the room to create veins of protection around objects and to carry away all particles towards renewal openings that are generally placed in the intermediate ceiling.

This solution is the most frequent one. It enables class 1 dust levels to be obtained meaning that there is no more than one particle larger than 0.5 $\mu$m in a cubic foot (1 foot=0.3048 m, standard 209 Federal Standard, Airborne Particulate Cleanliness Classes in Clean Rooms and Clean Zones). With this mode of protection, it is expected that classes lower than 1 will be attained. Since all possible limits have almost been reached where filters are concerned, the only way to achieve greater cleanliness is to increase the number of air renewals in the room.

It is clear that the limits of "clean room" technology have been reached, and that if there are any improvements to made, they can only be achieved by a significant increase in operating costs resulting from the quantity of energy needed to ensure the recycling of air.

In this solution, silicon wafers 10 are arranged in baskets 11 containing twenty-five wafers. As FIG. 1 shows, these baskets 11 are manually loaded onto the input-output ports of the production equipment, this operation being a particularly contaminating one.

For transportation within the production or storage unit, baskets are arranged and protected by a transportation box 12.

FIG. 1A shows the work and equipment areas and the input ports of cross-wall equipment. This figure represents one reactor 1, a robot 2, an elevator 3, operations 4 being manual operations. FIG. 1B represents the circulation and storage areas. A second solution consists in limiting the "ultraclean" volumes to only those places where silicon wafers are handled. Therefore, these mainly concern work stations. Mini-environments are created around these sensitive areas (Enclosure on Canopy) in which a very sensitive filtering system (5) is installed as shown in FIG. 2. As in FIGS. 1A and 1B, FIG. 2A corresponds to work areas and FIG. 2B to transfer and storage.

In this case, baskets 11 of wafers 10 are placed in to boxes 12 (or "Pod") that are "practically" airtight. These boxes are automatically opened (6) in the ultraclean environment of the mini-environment to enable basket 11 or wafers 10 to be transferred under excellent conditions of cleanliness. This technology, used mainly in the field of microelectronics, is called the Standard Mechanical Interface (SMIF) and results in significant reductions in operating costs. This approach doubtless enables a slight improvement in the dust class, however it is faced by the same limits as those of the conventional clean room.

Furthermore, these improvements are obtained to the detriment of an interfacing with more complex machines that often require costly robot elements.

To obtain classes of cleanliness that are lower than 1, the so-called WAFEC technology, depicted in FIG. 3, proposes the local creation of a mobile miniclean room around basket 11. This technology is designed so that the baskets of wafers can be placed on the machine inlets without any additional devices. Conditions of cleanliness are ensured by a permanent flow of ultraclean air around the wafers. Furthermore, a localized flow of air accompanies the wafer in an ultraclean air stream up to the machine reactor inlets. FIG. 3A corresponds to work areas and FIG. 3B to transfer-storage areas. In this technology, there is a dynamic protection of the enclosure, a close protection of wafers 13 and the automatic transfer of cassette 14.

As a result of this technology, classes lower than 0.01 have been attained. Although it is promising, the technology has not met with the expected industrial success. This is because the permanent generation of ultraclean air requires mobile air generators to accompany containers. These devices are however not accepted in a production environment.

These three solutions can doubtless solve the problem of particulate contamination, but none of them can guarantee an environment that is free from molecular contaminants that are always present in clean rooms and generated by all plastic components, filters, filter seals, baskets and transport boxes materials.

Moreover, these three solutions handle conventional baskets that often contain 25 wafers. None of these solutions provides the flexibility that the microelectronic industry needs to optimize the waiting time on machines in order to reduce cycle time.

To consider a solution to the problem of purity (an environment free from molecular contaminants), SMIF technology proposed the introduction of nitrogen in box 12 or Pod when the box is idle (or in storage).

Another approach that has been proposed (Portable Clean room) suggests a technology for transporting baskets between the different machines in containers maintained under nitrogen by a loaded nitrogen cylinder. This technology has the same disadvantages as SMIF technology concerning the transfer of objects in the equipment or process machines.

Another solution is that of individual containers. These have two objectives. The first is to create an ultraclean or ultrapure environment around the silicon wafers and the second is to enable considerable flexibility. This solution consists in confining the wafers in individual containers. There are different variants of this solution: the one proposed by IBM (references [1] or [2] at the end of this description and depicted in FIG. 4). The other has been proposed by the Atomic Energy Commission (LETI) (references [3], [4] and [5].

FIG. 4 shows, in particular, an individual container IBM 16, the opening area of container 17 and the module 18 of the equipment interface according to IBM.

The two technical solutions may be different, but they already offer many advantages as compared with mini-environment solutions of the SMIF type concerning the protection of silicon wafers against particulate and molecular contaminants as a result of improved tightness and possibility of environment renewal.

However such an approach still has a few disadvantages, namely:
the need to have a specific module between the container and the equipment to carry out the transfer of silicon wafers;
the non-continuity of the protection chain in protecting opening areas owing to the difficulty in making the container and the interface module completely airtight, given the opening systems of this type of individual container;
although individual interfacing of machines is theoretically optimal in terms of flexibility, it turns out to be sub-optimal for microelectronics applications. This is because, for optimal use, most processing equipment require that several wafers be simultaneously available at the machine inlet. Furthermore, individual transportation results in the considerable increase in the number of information transactions in order to guarantee the perfect monitoring of the produced objects.

Moreover, in the devices of prior art describing individual mini-environments, the doors are solid with opening and closing mechanisms and this has adverse effects on the "mechanical tightness" when they are coupled with the machine.

Also, gas supply ports are located on the sides. To ensure a collective gas supply, they must be stacked on a shelf fitted with gas distribution channels that make it possible to supply each cell.

All existing mini-environment solutions, whether collective (SMIF) or individual (IBM or CEA solutions) call for special adaptations of processing machines or for specific transfer modules to transfer baskets and/or wafers to processing machines. This major disadvantage, as compared with the conventional process, consisting in loading the basket directly onto the machine elevator, becomes more glaring in the case of equipment for vacuum production processes. This is because the equipment has an entrance airlock in which the basket is inserted. The airlock is then closed and brought to the vacuum level of the core of the machine in order to put the basket and said core in physical communication so as to enable the transfer of objects, as depicted in FIG. 5.

FIG. 5A shows a first step of the opening of the airlock 20 and the insertion of the basket 11. The door of the airlock 21, a valve 22, an empty transfer module 23, a transfer robot 90 and a processing chamber 25 are represented in this figure.

FIG. 5B shows a second step of the closing of the airlock 20 and the lowering of pressure in the airlock.

FIG. 5C shows a third step of transfer. Valve 22 is opened to allow the robot 90 of the transfer module to exchange wafers 10 between the basket 11 in the airlock 20 and the processing chamber 25.

In the case of solutions of the collective mini-environment type, there are two solutions for transferring flat objects. The first one, depicted in FIG. 6, consists in transferring basket 11 into the airlock using an automated arm 75 after the container 12 or Pod has been opened. The second solution, depicted in FIG. 7, consists in transferring the silicon wafers 10 from basket 11 belonging to the container to another basket 27 that is permanently installed in airlock 20. In this case the transfer may be carried out by a multiple-finger robot 90, often built in the airlock.

In the case of individual mini-environments, as depicted in FIG. 8, the robot of an interface module 29, which has been described earlier on, ensures the sequential transfer of the wafer in a basket that is permanently installed in airlock 20. Individual containers are sequentially connected to the interface module to transfer the number of provided wafers into the basket 27 of the airlock. An additional valve 34 permits the insulation of the airlock from the interface module. It has the same function as the airlock door.

Thus several devices of the prior art enable the transportation of such semiconductor wafers:
The first ones are the conventional devices or standard baskets in which wafers are placed as depicted in FIG.

1. These baskets can be transported in transport boxes. They are protected from contamination by passing ultraclean air in the clean room, especially during the transfer of the baskets from the transport box to the machine.

The second ones are SMIF-type collective mini-environments that permit the simultaneous transportation of several semiconductor wafers. They are static devices that retain the memory of the environment in which they are opened. A mini-environment of this type is moderately airtight and a purge of said environment may even be necessary. This mini-environment requires a specific interface with vacuum equipment, for example to perform a basket transfer or a wafer transfer as shown in FIG. 2. There is a variant to protect the wafer better and recreate a clean atmosphere around the wafer, as shown in FIG. 3.

The last mechanism consists of single-wafer mini-environments like those described in the references given at the end of this description. These mini-environments, which are active mechanisms, containing nitrogen, require a large number of transfers. Even though the equipment processes one wafer after the other (Single Wafer processing), they all have entry buffers that require a minimum number of wafers.

Today semiconductor wafers are protected against particulate contamination. Nevertheless, to guarantee production yields, it is essential that these wafers be protected against molecular contaminants such as Volatil Organic Contaminants (V.O.C.).

V.O.C.s are of different origins:

components found in outer air prior to filtration;

degassing of all the plastic components use create clean rooms, filters, filter seals, plastic panels, etc.;

baskets and transport boxes for wafers;

semiconductor wafers after those processes release amines, acetones, etc.;

The presence of these contaminants has several disadvantageous effects:

the existence of yield losses, or the need for additional process steps to t semiconductor wafer surfaces prior to certain critical processes.

The maintenance of an "inert" environment around semiconductor wafers to eliminate this kind of contamination proves to be necessary. An example of such recommended gases is nitrogen. It provides an oxygen-free environment (no increase in native oxides) and a vapor-free environment (no metal corrosion) used to carry out interconnection levels.

A first document of the prior art, patent application WO-A-92 02950, describes a device for the storage, transportation and protection of substrates in clean room conditions. The substrates are stored separately in cassettes that can be tightly provided on top of each other. The cassettes are positioned, using a hoist, in front of a loading slot in the clean room. A lateral airtight cover on the cassette is opened and the substrate is picked up, passed through said slot and placed on a stand.

A second document of the prior art, patent application EP-A-0 591 085 describes a gas purging system for an insulation enclosure for contamination sensitive elements. This enclosure comprises a casing and an adapted closing element for purging gases in the enclosure. The closing element comprises filters and vapor and moisture drains.

Today, those skilled in the art are faced with several problems:

Guaranteeing an ultraclean and ultrapure environment that necessitates a continuous purity chain, around flat objects such as semiconductor wafers. The environment of semiconductor wafers will always be inert so as to maintain the wafer in an environment that is free from molecular contaminants. Volatile organic contaminants (VOC) are a type of contaminant that are particularly defect generating.

Reducing cycle-time and hence the number of idled wafers. This problem will be solved by introducing flexibility in batch sizes to optimize waiting time on machines without going so far as the extreme flexibility of individual transportation, an option that is optimal only for a limited number of machines and that increases the number of information transactions.

Interfacing a processing equipment without an intermediate module, and in particular, introducing equipment such as conventional baskets in the empty airlock.

The object of this invention is to solve the two problems (insulation of wafers in an adapted environment -preferably a nitrogen environment - and the possibility of flexibility) and to propose a device, the use of which remains very close to the conventional methods with standard transport baskets so as to retain the same type of interface with a processing equipment, even for vacuum a processing equipment.

SUMMARY OF THE INVENTION

The present invention relates to a device for transporting flat objects confined in a specific atmosphere, also called a cassette, comprising at least one assembly provided with several thin flat cells that open onto the lateral faces of said assembly arranged in parallel, each cell being provided to receive a flat object and to be closed by an independent door characterized in that the cells are associated together by the same ventilation system, and in that each assembly comprises a gas supply shaft element and a gas exhaust shaft element, and in that the shaft elements of each assembly have a self-locking connector on each side.

Advantageously, each door is removable to permit the interface with processing machines. Indeed, the door of the invention retracts into the connecting flange solid with a processing machine and prevents leakage between the cell and said machine.

Advantageously, the cells are separated from each other by a constant pitch.

Advantageously, the closing and opening of each door are ensured by locking and unlocking means.

Advantageously, the two shaft elements placed on the side of the assembly opposite the openings and associated with a handle, enable said assembly to be grasped.

Advantageously, each cell is provided with means for lifting and stopping the flat object contained therein.

Advantageously, each assembly is provided with at least one means for identifying said assembly.

Advantageously, each assembly is provided with at least one internal pressure sensor.

Advantageously, each assembly is provided with means enabling each door to be sealed, independently of each other. Said means also serving to remove each door when it is opened.

Advantageously, each assembly is provided with means for transferring information to the other assemblies to which it is associated.

Advantageously, according to the invention, these assemblies can be attached and detached from each other manually or automatically.

In one varying embodiment of the invention, each assembly is composed of several modules, each of which comprises a cell. Each module, called the base module, consists of an enclosure with two casings on each side.

Advantageously, the enclosure is made of a material of the polycarbonate family slightly charged with conductive fibers. Said enclosure protects flat objects from molecular and chemical contamination, neither desorbs nor absorbs molecular contamination, and is conductive enough to avoid the accumulation of electrostatic charges. This material is moreover advantageously light.

Advantageously, a layer of silica that has been made slightly conductive to evacuate electrostatic charging is deposited within the enclosure.

Advantageously, slots have been provided in the casings to receive bayonets, an assembly lock, a module identification tag and/or a rewritable radio-frequency tag that can memorize the identification of the object and/or information on the progress of the process being applied to the object in the enclosure.

Advantageously, casings comprise holes allowing for the passage of position blocks.

Advantageously, once the two casings have been assembled around the enclosure, they form an electrostatic and electromagnetic screen that protects the object within the enclosure from electrostatic and electromagnetic disturbances.

Advantageously, the casings are made of plastic that has been strongly charged with conductive fibers to make them extremely conductive.

Advantageously, the enclosure consists of
position blocks for positioning the different enclosures with respect to each other when different modules are assembled;
a locking device;
two shaft elements;
two devices allowing for the lifting of flat objects and gas distribution;
a door and maneuver bayonets.

Advantageously, the shaft elements are placed on the same plane as the enclosure so that the two shafts of the assembly are obtained when several modules are stacked to form an assembly.

Advantageously, the locking means allows for the assembling of modules and for the electrical ground connection in order to facilitate the flow of electrostatic charges accumulated on the flat objects and in the enclosures.

Advantageously, this locking device has slots in which sensors are placed.

Advantageously, the locking device comprises a bolt mounted on a protrusion on the box that has two grooves in which the lock can move to complete the assembling.

In another embodiment, each module is made in a single piece comprising at least one transparent area. Each module may have a male-female-type ribbing. The non-transparent part of each module may be made of a charged fiberglass or silica needle polycarbonate and the transparent part of polycarbonate. Each module may comprise transparent end-shields mounted on a frame or may be made of a sandwich molding.

In another embodiment, the device of this invention comprises a module association system formed by complementary shapes in the form of ear-pads. Each module comprises an upper ear-pad and two lower ear-pads on each side. The lower ear-pads have a mechanism which makes it possible to join the modules together and to exert sufficient pressure to ensure precise positioning and tightness. Each mechanism comprises a pin with a beveled plane which is solid with a spring that permits the insertion of the pin into the corresponding lower ear-pad. Both ends of each upper ear-pad are fitted with a wedge that can react when two modules are placed one on top of the other, when bevels of the pin are fitted to transform the pressure exerted on the pins into a force that will tend to fasten the two modules to each other. The movement of the handling fingers solid with the pins inside the slots in the lower ear-pads allows the pins to be maneuvered in order to separate the upper module from the lower module.

The locking device permits the association of several modules, and/or several assemblies, or at least one module and at least one assembly.

Each door is provided with blocking means making it possible to maintain the flat object in contact with two stops located on each of the lifting devices to ensure that the object is positioned and maintained in the module.

Each device that permits the lifting of a flat object is in the shape of a tube that is punctured with holes permitting the supply and distribution of gases. The object is blocked by two stops provided pins in the first ends of the two tubes that serve as a gas supply and open into a shaft element and through the door and its blocking means. The blocking means may be a spring.

In another embodiment, the device of this invention comprises two lifting devices located on each side of the module. They form a plenum chamber with the inner wall of the module and this permits the gas to be distributed within the module with a transversal flow using an injection apparatus, and evacuated with an exhaust apparatus. The object is blocked by a wedge-shaped rigid positioning system that is solid with the door, two spring-stops, and two forks fixedly attached to the lifting devices. The lifting devices comprise two spring-stops and two forks. These stops support the flat object and push it forward when the door opens in order to release it from the forks.

In another embodiment, the door comprises a seal, a body and a module locking device. The seal abuts the lifting devices when the door is closed. The seal is sheathed with a sheath that permits the pressure of the seal to be evenly distributed on the entire perimeter of the nose of the module. The seal comprises a wedge-shaped slot that can block the flat object.

Each module comprises positioning means for positioning the modules with respect to each other, locking means for locking said module with another module to which it may be joined, means for opening doors, means for lifting objects and means for distributing gas.

In another embodiment, each module comprises means of identification and/or control sensor means and means for transferring information to the other modules.

The structure of a module is such that a variation of ±3000 Pascal in the internal pressure with respect to external pressure does not cause the slightest modification in features and tightness.

Advantageously, in each assembly, a seal is placed between two shaft elements corresponding respectively to two different modules so as to ensure tightness between two successive modules called intermediate modules.

Nevertheless, an assembly called a unit assembly may be formed with a single module containing one cell.

Advantageously, shaft elements receive, depending on the nature of the module which they belong to, a seal at each end (in the case of an intermediate module), a seal for the side joined to an intermediate module and a connector for the side that is likely to be connected to another assembly (in the case of a terminal module), or a connector at each end (in the case where a module is a unit assembly).

In another embodiment, shaft elements receive a filtering element allowing for the filtering of particles that may have been released during the connection/disconnection of the modules. The filtering element comprises a central collar composed of a rigid collar on which a filtering diaphragm has been mounted.

Advantageously, the self-locking connector comprises a flap that is mounted on a spring guided by an end plate made tight by a seal on the corresponding shaft element, a lip seal ensuring that shaft elements and additional forms are hermetically sealed from each other.

In another embodiment, the filtering element comprises a collar made of filtering material. The self-locking connector comprises a tripod-shaped plastic diaphragm that is embedded in a location provided in the lower part of the end plate that has a tapered area.

Each assembly is fitted with automatic or manual means that lock it to another assembly (that may or may not be a unit assembly) to which it may be joined. This is to permit the joining and separation of at least two assemblies that may or may not be unit assemblies.

An assembly En+1 is assembled onto an assembly En by pushing a lever of the assembling mechanism of assembly En so as to avoid displacing En+1 with respect to En since En is already blocked with respect to En−1.

This assembling process can be applied to the assembling of modules. To obtain assemblies from unit modules, after having obtained a stack of modules, all the maneuver levers of the intermediate modules are removed. Only the lever of the upper terminal module is maintained since it will be used to secure another assembly.

In a particularly advantageous example of the embodiment of the invention, the flat objects are semiconductor wafers.

The invention also relates to a process of transferring a flat object from a cell of the device described above into a processing machine, characterized in that said device is positioned so that each cell can communicate with the machine so that a robot, fitted on said machine, can transfer said object in one direction or the other while preserving the pure and clean environment surrounding the object during the transfer.

Advantageously, to carry out a connection, the following steps are followed:

positioning the device of the invention on the machine plate;

positioning at least one cell in front of the mobile jaw of the flange;

airtight connection between at least one cell of the device of the invention and the machine by displacing the mobile jaw of the flange using a translation mechanism solid with the flange;

purging the dead volume between the cell door and the mobile jaw;

bringing the door of the cell into contact with the door of the. mobile jaw by moving the bayonets associated with the cell through a mechanism solid with the fixed part of the flange. The movement of the bayonets thus permits the interlocking of the two doors;

simultaneous opening of the two interlocked doors to trap contamination on the interface. This retraction, performed by a mechanism solid with the mobile jaw, releases a space that is large enough to let through the finger of the machine's internal robot to enable said robot to pick or place a flat object into the cell (for example a silicon wafer);

transfer of the flat object by the robot;

insulation of the cell and machine from contamination: an appropriate gas flow is created in the mobile jaw in order to insulate the inside of the casing from contamination with respect to the machine so as to prevent the contamination of cells during the transfer of the flat object. Nevertheless, in the case of vacuum equipment, there is no injection of gas but a connection to the vacuum circuit;

simultaneous closing of the flange mechanism of the two doors kept in contact; once the position has been reached, the door of the mobile jaw hermetically seals the machine, whilst the door of the cell does not hermetically seal the cell;

reconditioning of the atmosphere in the cell before closing. In this position the purity of the casing is reconditioned by injecting an appropriate gas. However, this operation is not performed for vacuum equipment;

separation of the two doors by activating the mechanism on the flange, on the bayonets of the cell door, and the backward movement of the cell door until the cell is hermetically sealed.

removal of the mobile jaw by activating the transfer mechanism solid with the flange.

possibility, therefore, of indexing to open another cell or remove the device of this invention from the machine.

Advantageously, at least one flange is used, comprising a mobile part that is closed by a door which moves towards at least one of the cells to be opened so as to seal the machine and the cell. A mobile jaw is connected to the fixed part of the flange by bellows to ensure translation and guarantee tightness with the machine. In the case of a connection with vacuum equipment, metal bellows are used. The flange is fitted with means permitting the opening of the door of the cell and the door that closes the flange, so as to create a tight communicating tunnel in which the robot and the machine can carry out the transfer of the object.

The door, which is independent of the corresponding cell and removable, is completely detached from said cell at the time of opening to clear the passage of the robot completely.

In an example of the embodiment, a mechanism, which permits the locking of the door to close the cell is controlled and driven by a complementary mechanism solid with the door of the opening flange. The association of these two mechanisms unlocks the door closing the cell and clears said cell, the two mechanisms being joined together.

Owing to the several mechanisms fitted on the flange, it is possible to move the mobile jaw forward or backward, engage the two stops solid with an ear-pad mechanism on each side of the cell so that the mobile jaw can exert pressure on the cell and thereby ensure tightness without displacing the device of this invention. A mechanism moves the bayonets to ensure the transfer of the cell door to the mobile jaw door so as to clear this door and to enable it to retract into the mobile jaw. The mobile jaw is fitted with a mechanism that enables the two doors to retract.

Advantageously, the position of the cell to be opened is checked prior to the approach. The position of the robot's finger or the object is checked when an object is picked or placed so as to carry out the operation without friction. Identification of the object may be read when it passes by an electro-optical device.

Advantageously, two stops solid with the ear-pad mechanism allow for the precise positioning of the device of this invention to be maintained whilst the mobile jaw, provided with a seal, exerts pressure on the seal so as to ensure that the cell considered is tight.

Advantageously, the flange is provided with means for purging dead volumes and restoring the pure environment of the cell prior to closing it. It is also provided with means for checking the position of said device, for checking the relative position of the object at the time of transfer, and for reading its identifier during transfer.

Advantageously, when- the machine uses a vacuum process and when it is necessarily provided with a transfer airlock, the device of the present invention, also called a cassette, may be installed in the airlock. In this case vacuum is created simultaneously in the different cells of the device, through the shafts, and in the transfer airlock of said device.

Interfacing, as described above, is then carried out for the transfer of objects to machines, the processes of which are performed in a vacuum without breaking the clean and/or pure chain surrounding the objects and especially without resorting to additional operations to remove the objects from cells and put them back into the machine's airlock. This decrease in pressure, that takes place simultaneously in each cell, is carried out and regulated by means that use the information from pressure sensors installed in the cassette and in the airlock. These means comprise a pumping device. The same means also permit an increase in atmospheric pressure by simultaneously controlling the injection of nitrogen in the airlock and cells.

With this invention, semiconductor wafers are made accessible to robots inside the equipment without resorting to additional robots.

The main advantages of the present invention with respect to devices of the prior art are explained in table I at the end of the description.

BRIEF DESCRIPTION OF THE DRAWINGS

FIGS. 1 to 3 depict various devices of the prior art, with FIGS. 1A, 2A and 3A corresponding to work areas and FIGS. 1B, 2B and 3B corresponding to transfer and storage areas;

FIGS. 4 to 8 depict other devices of the prior art;

FIGS. 13 to 20 depict a second embodiment of the device of the invention based on modules; FIGS. 14 and 16 to 20 depict various characteristics of a base module of the device of the invention;

DETAILED DESCRIPTION OF EMBODIMENTS

Figure 5A:
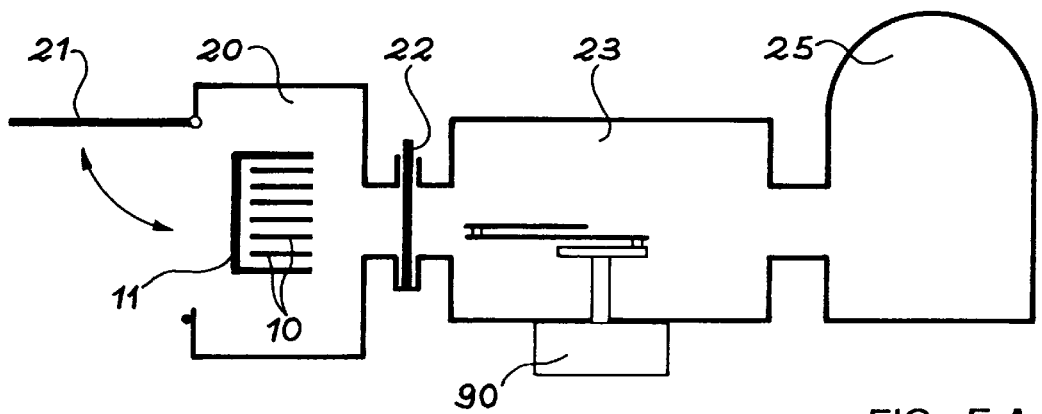
Figure 5B:
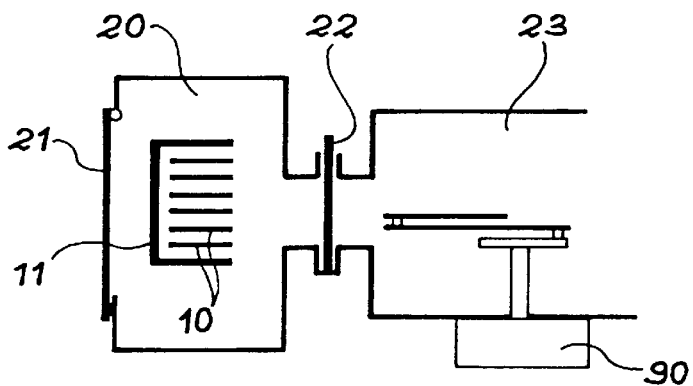
Figure 5C:
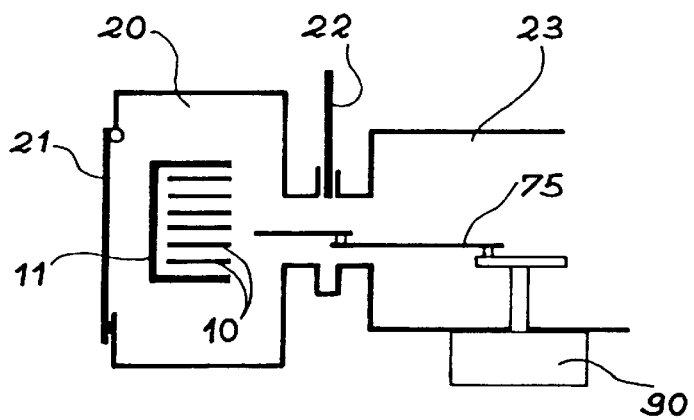
Figure 6:
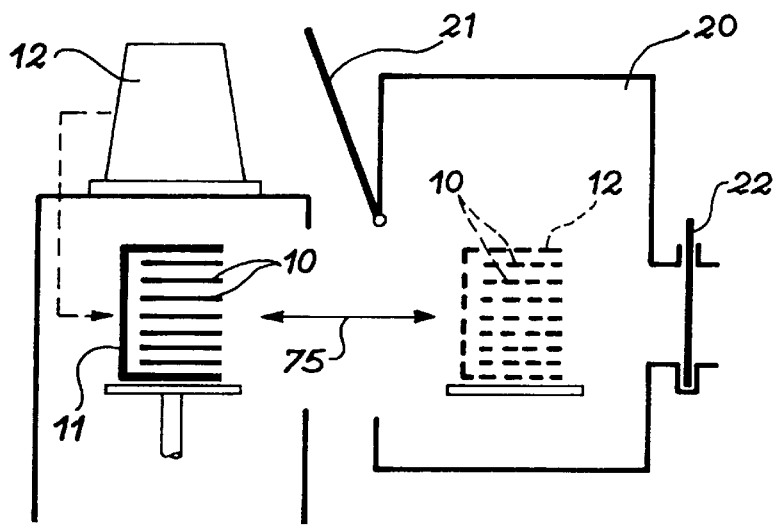
Figure 7:
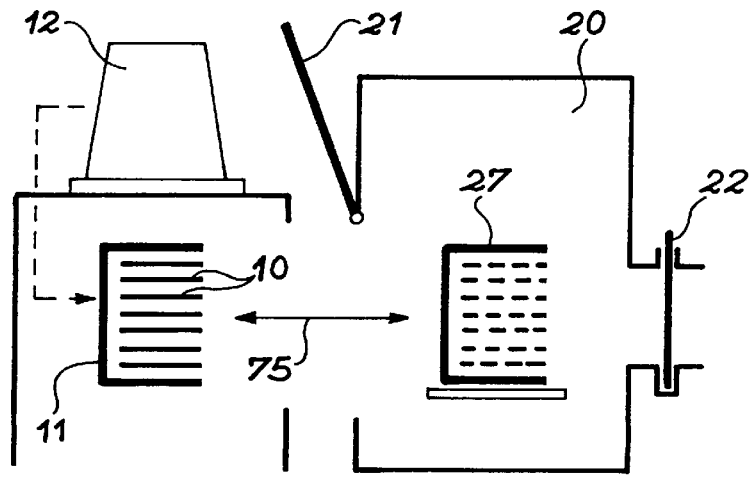
Figure 8:
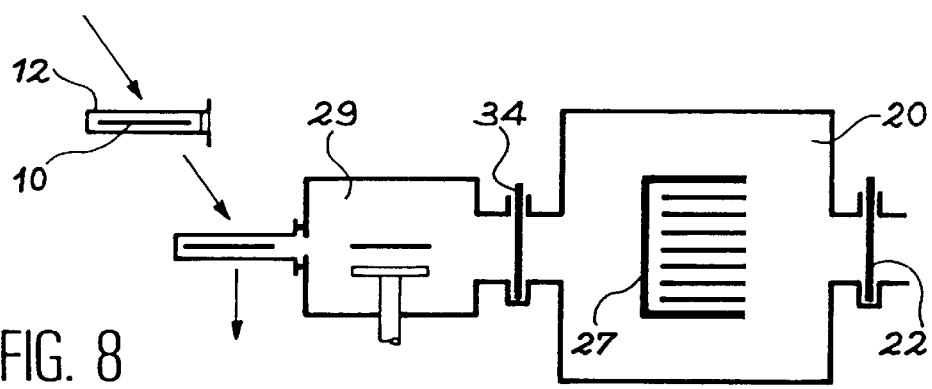
Figure 9:
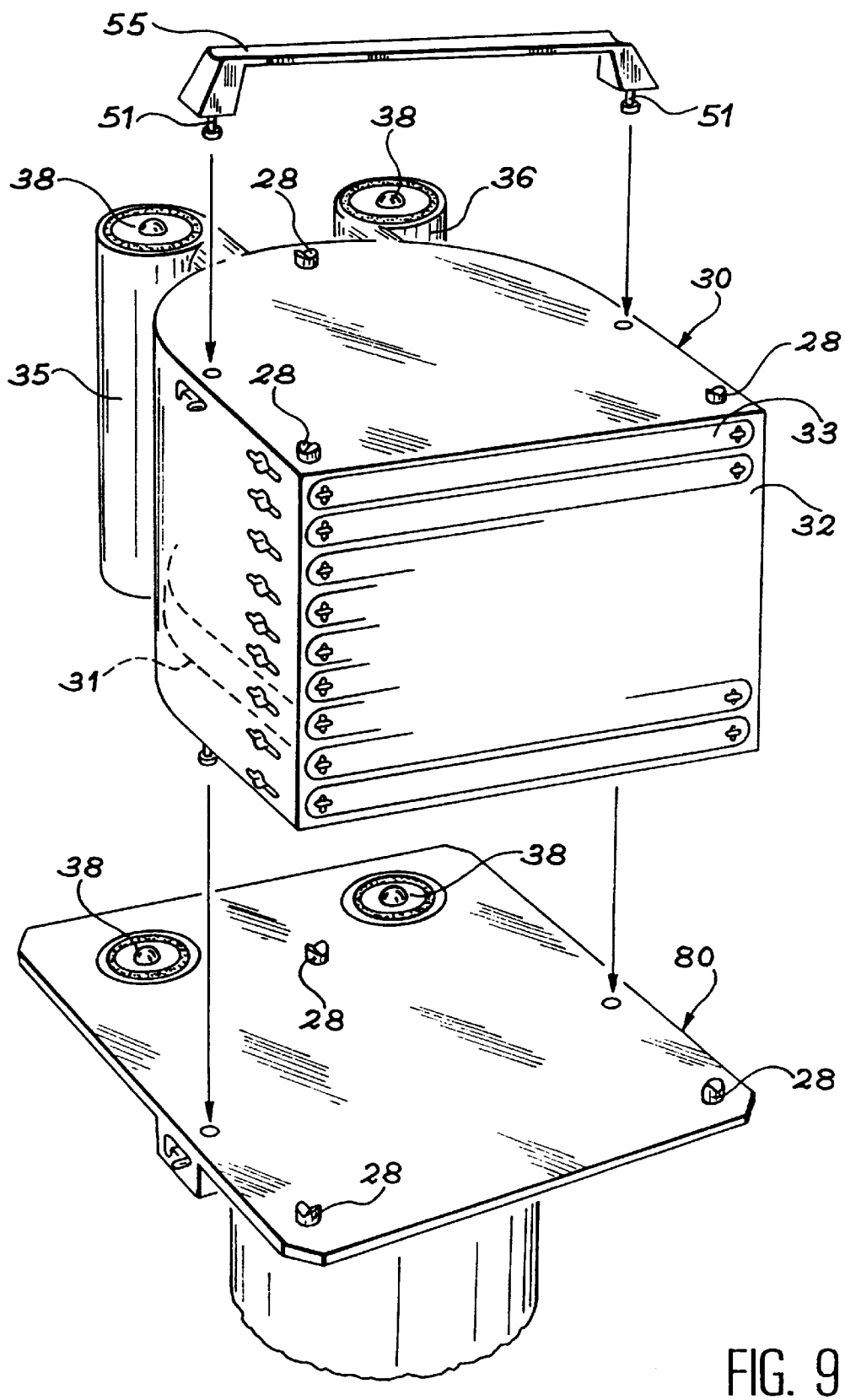
FIGS. 9 to 12 depict a first embodiment of the device of the invention.

The present invention relates to a device for transporting flat objects 10, for example semiconductor wafers, confined in a determined atmosphere. These can be, for example, as shown in FIG. 9, a plastic or metal assembly 30, provided with one or several thin flat cells 31, (nine in this case) that open into a lateral face 32 of said assembly, arranged in parallel, and linked together by a common system of ventilation. Each cell is fitted to receive a flat object 10 and can be closed by an independent door 33 which extends on the whole length of the lateral face. Each door 33 can be separated from the assembly. The closing and opening of each door 33 are carried out by a locking and unlocking device. Cells 31 are separated from each other by a constant pitch.

Each assembly 30 comprises a gas supply shaft element 35 and gas exhaust shaft element 36. These two shaft elements are arranged on the side of the assembly opposite the openings, associated with a handle 55 that permits the assembly to be picked up. This handle 55 for handling the device of the invention can be assembled as another assembly 30 on the upper side of said device.

Shaft elements 35 and 36 end in a self-sealing connector 38.

Each assembly 30 comprises means 28 for positioning the various assemblies with respect to each other, means 51 for assembling an assembly with another one with which it may be associated, means of identification, means for lifting the object in each cell and distributing gases, control sensor sensor means and means for transferring information to other assemblies with which it may be associated.

Figure 10:
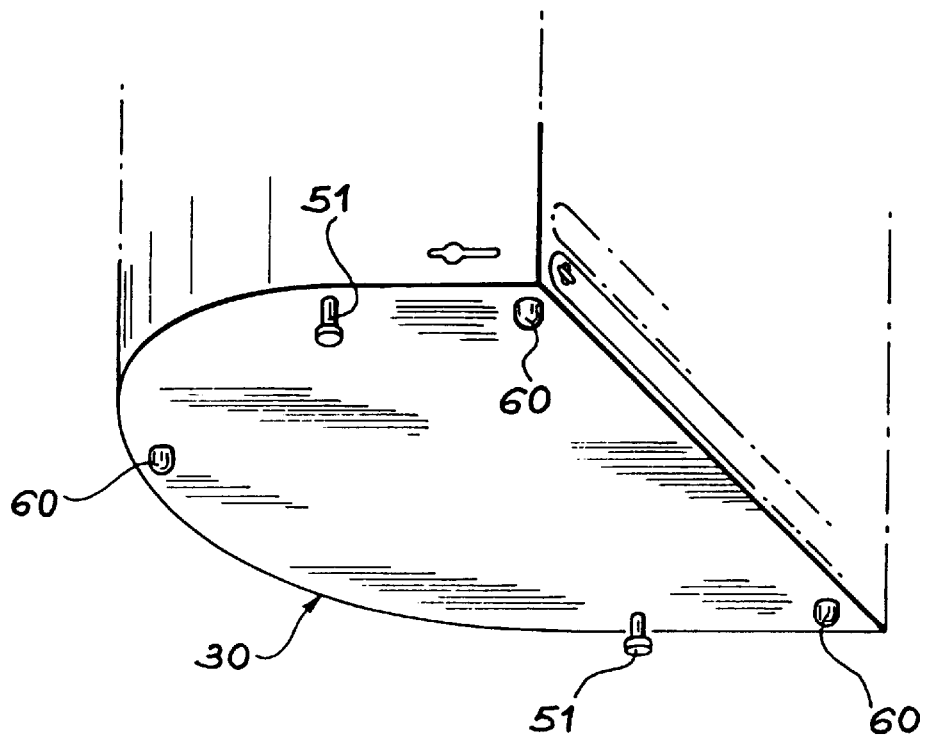
Figure 11:
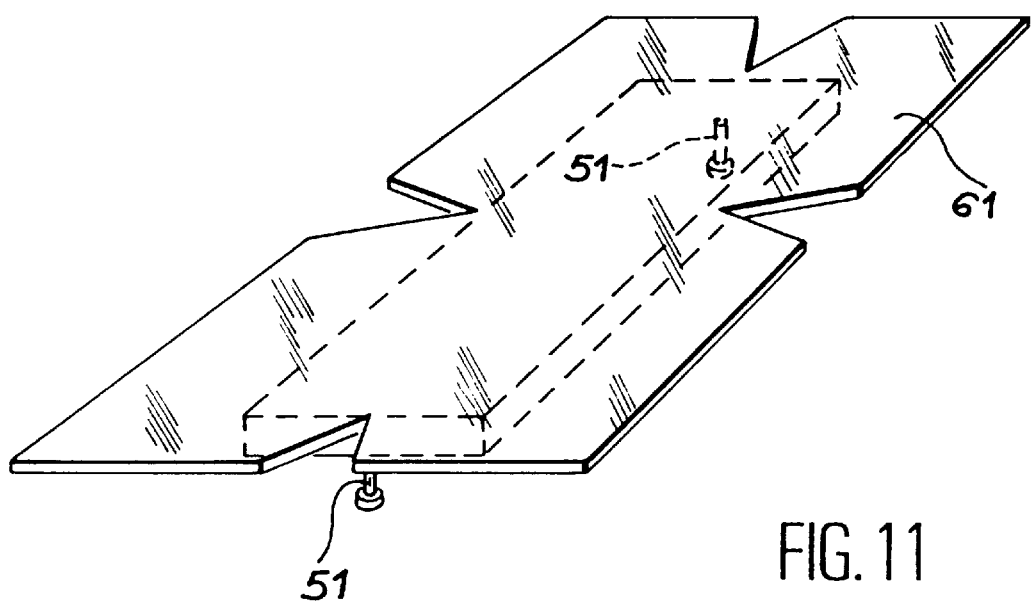

FIG. 9 also represents a plate 80 on which the device of the invention may be placed. FIG. 10 depicts the lower face of the device of the invention provided with spikes 51 and location blocks 60. FIG. 11 depicts a plate 61 that is compatible with the same assembling mode as handle 55 with respect to the robot's grasp.

Figure 12:
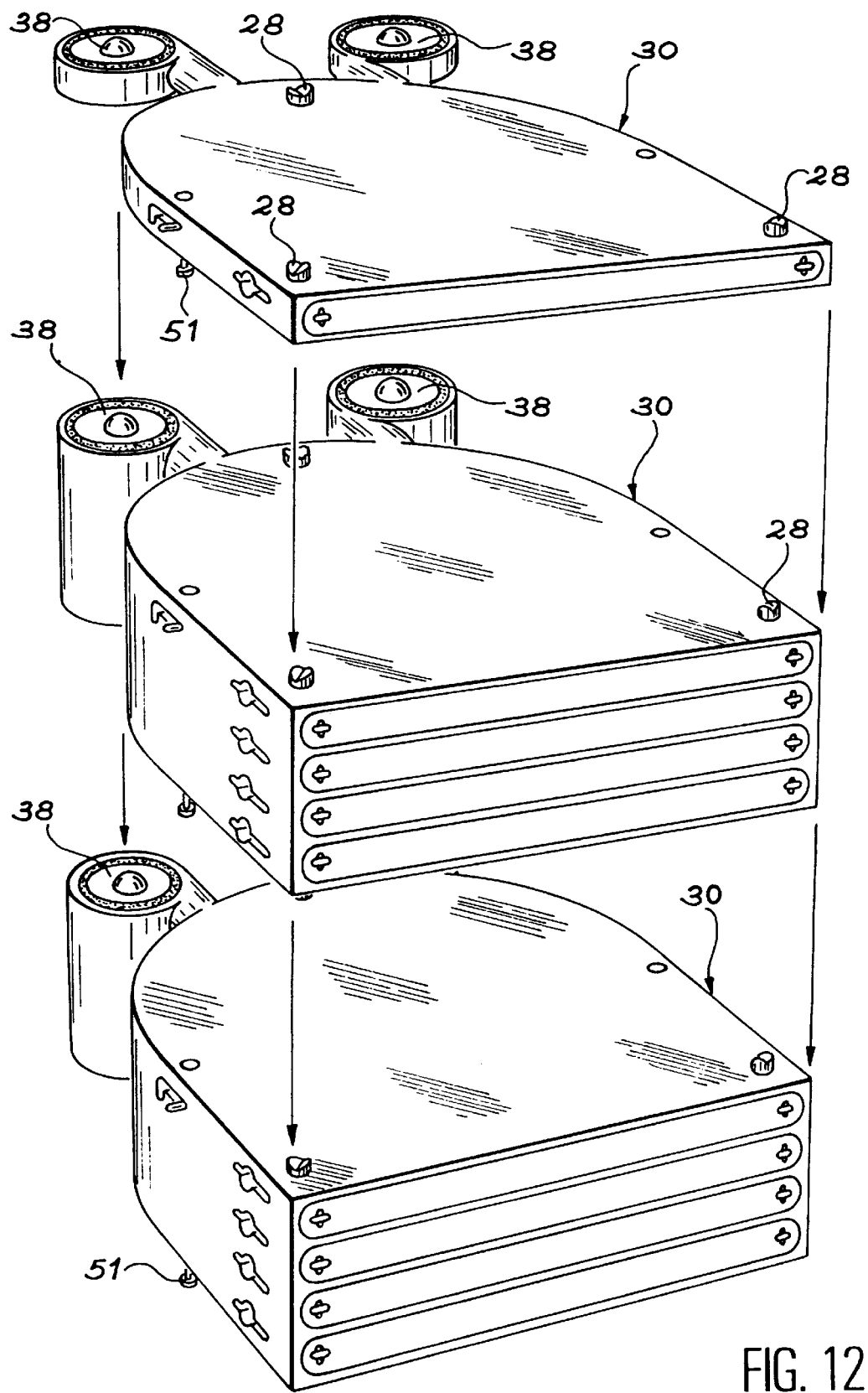

As shown on FIG. 12, the device of the invention, also called a cassette, may be composed of one or several assemblies 30 as defined above, associated together, with each assembly comprising one or more cells.

Figure 13:
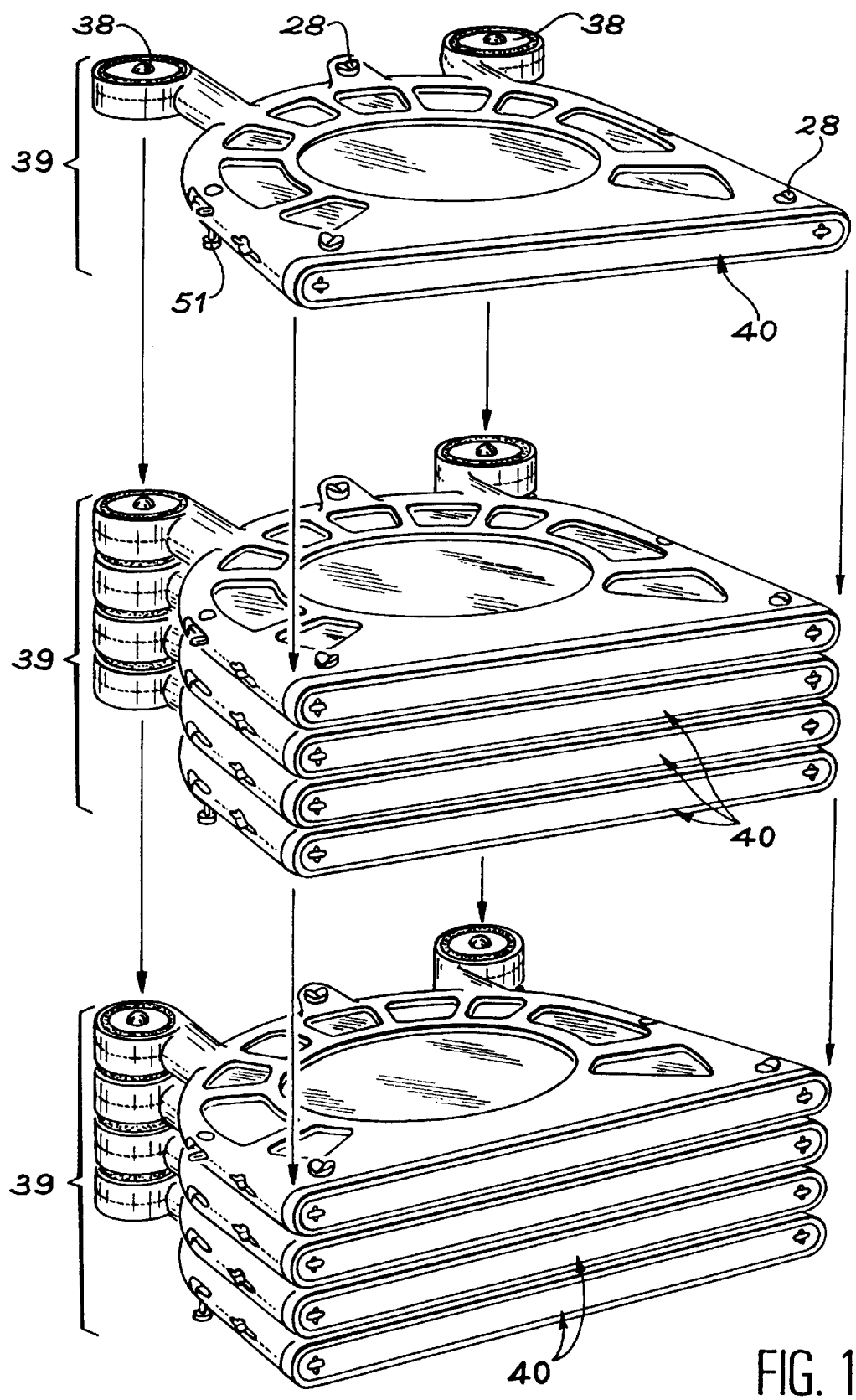

In another embodiment depicted in FIG. 13, the device of the invention is composed of one or several assemblies 39. However, each assembly 39 is itself composed of one or more modules 40 mechanically and inseparably associated such that each cell now corresponds to an independent module. Whatever the composition of the cassette, these various assemblies can be separated during cleaning operations, and associated on request to create another processing batch of flat objects since this new association is fixed for the entire cycle.

FIG. 13 represents, by way of example, an assembly 39 consisting of a single module 40 and two assemblies 39 composed of four modules 40.

The unit module 40 can be used to receive an object 10, for example a semiconductor wafer used as a reference.

The assemblies composed of one single piece as depicted in FIG. 9, or one or several modules as depicted in FIG. 13, can be associated and separated to obtain a transporting device that is flexible to use, i.e. adapted to the operator's needs. The pitch between the various cells and even the connection of two assemblies remain the same.

Figure 14:
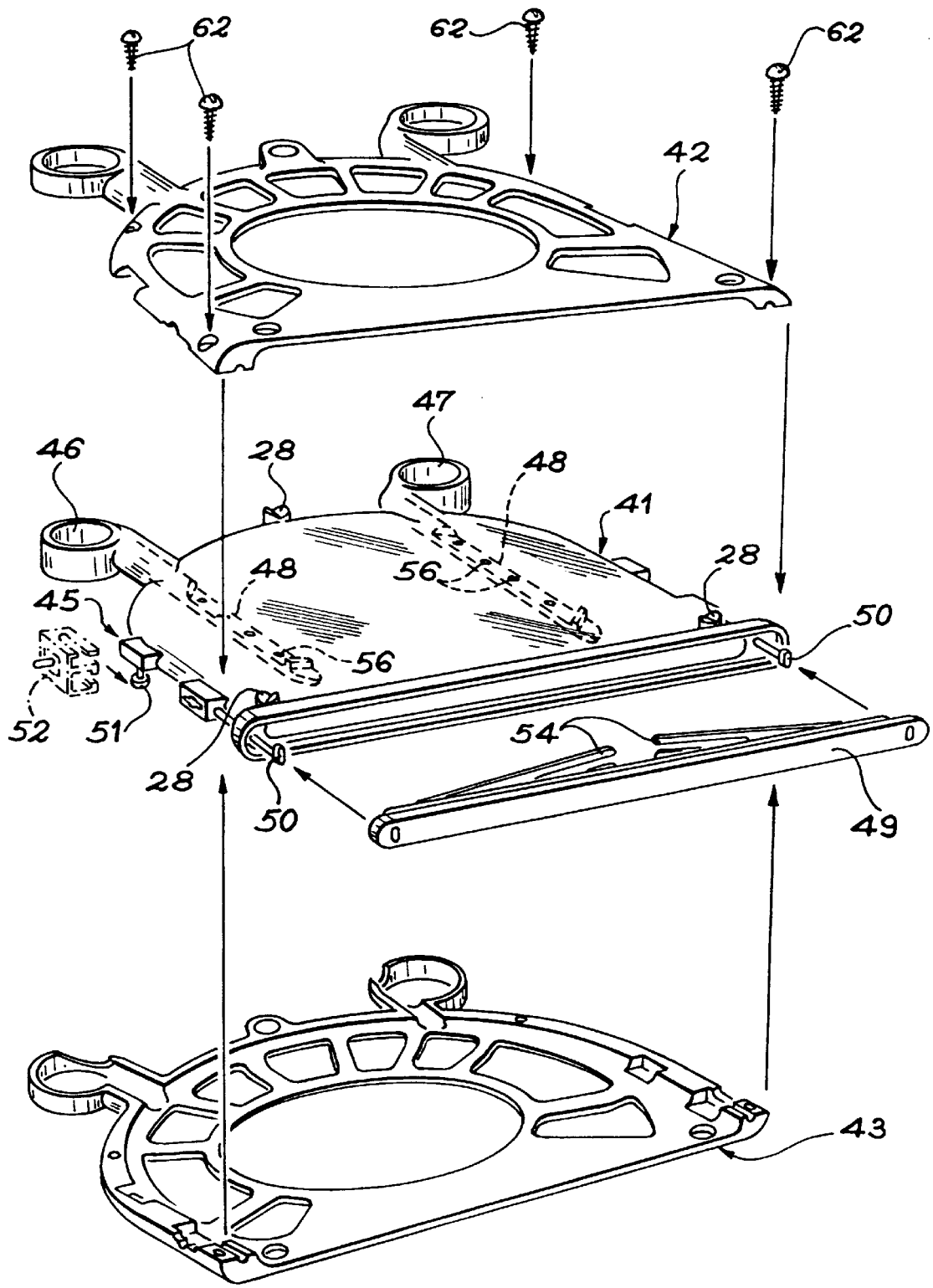

As represented in FIG. 14, a base module 40 consists of an enclosure 41 with two casings 42 and 43 on each side. These are assembled together and protect the enclosure 41.

Figure 17:
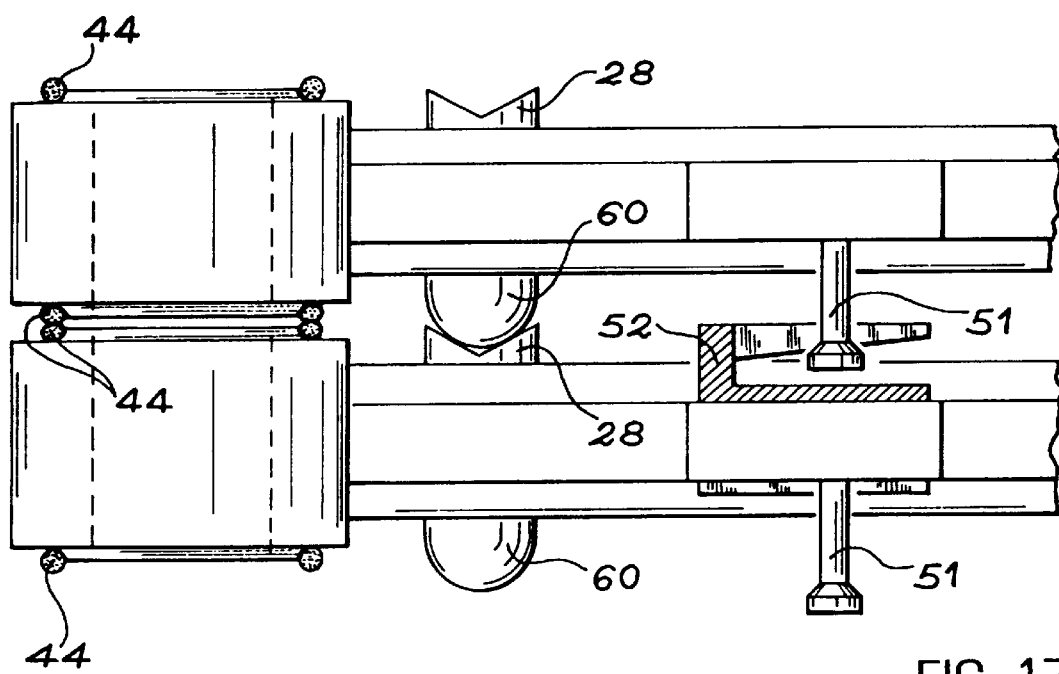

This enclosure 41 comprises:
  location blocks 60, depicted on FIG. 17 in particular, for positioning each enclosure with respect to the others during the assembling of the various modules;
  an assembling device 45;
  shaft elements 46 and 47;
  two devices 48 permitting the lifting of flat objects and gas distribution within the enclosure;

a door 49 for sealing the enclosure 41 and maneuver bayonets 50 to open, close and keep the door closed, to move the door forward within the connecting flange, release said door so as to enable it to retract in the flange.

Enclosure 41 is ideally made of material that protects flat objects 10 from molecular and chemical contamination, that neither desorbs nor absorbs molecular contamination, that is conductive enough to prevent the accumulation of electrostatic charges and is advantageously light. In practice, materials from the polycarbonate family, lightly charged with conductive fibers can be used.

Figure 15:
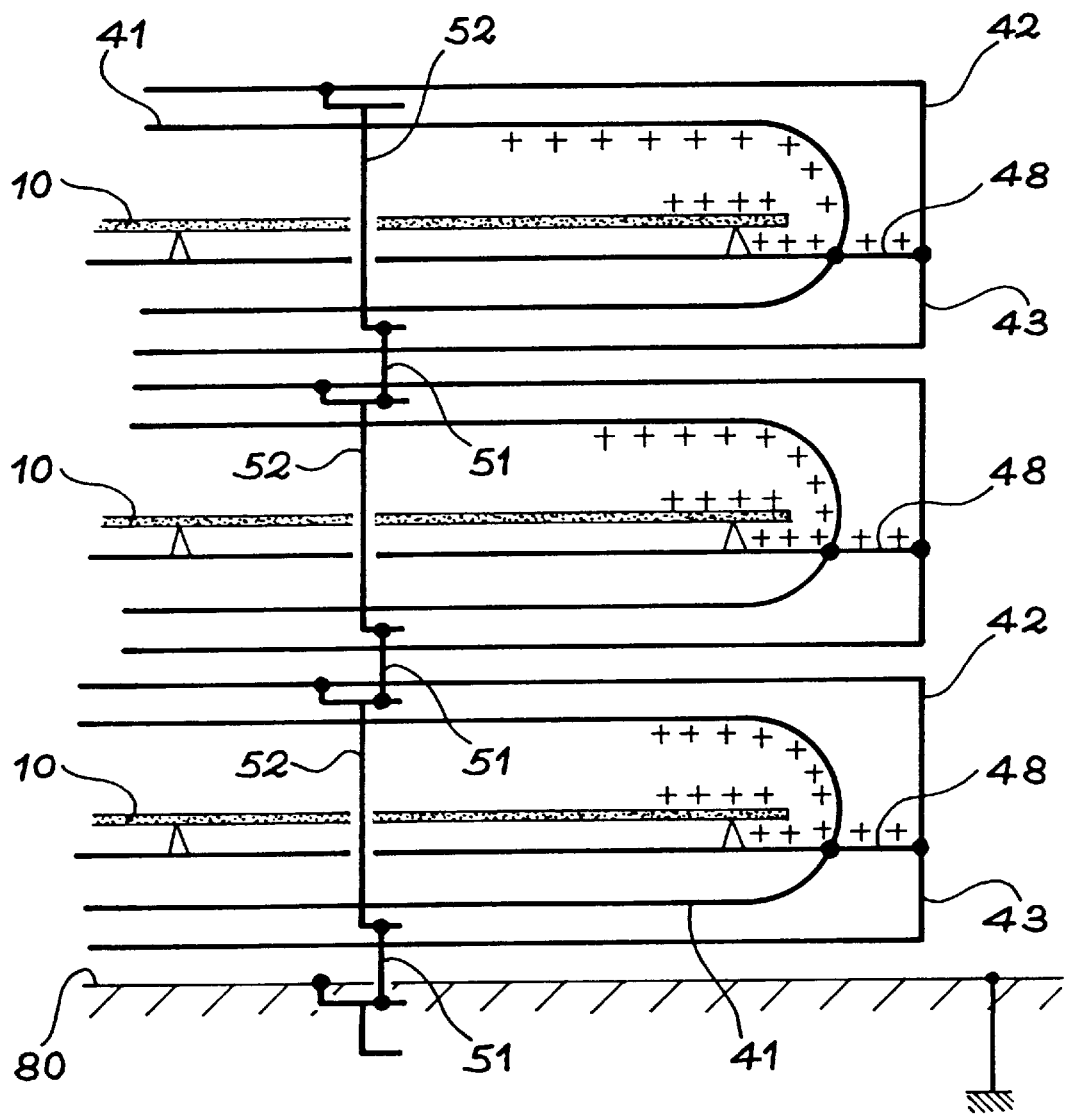
Figure 16:
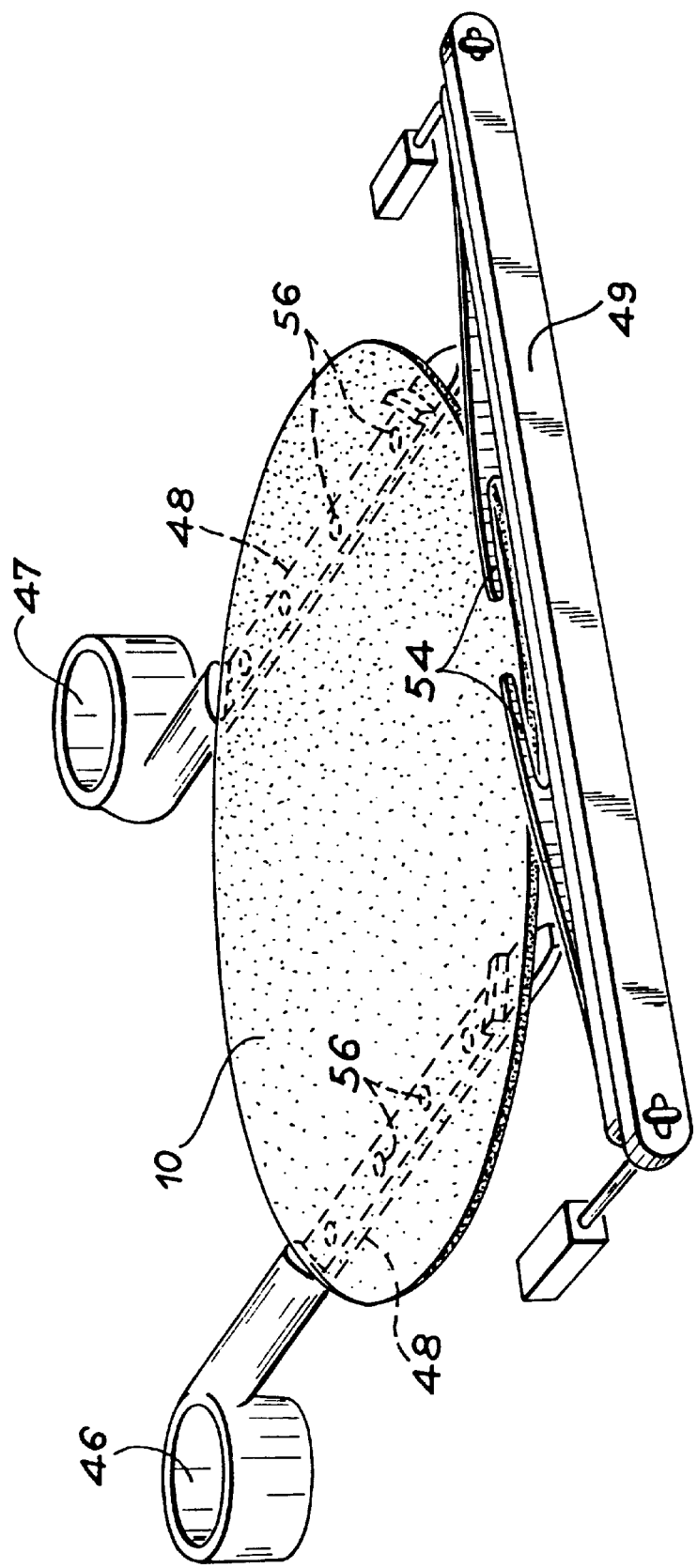

For microelectronic applications, a silica-based layer that has been rendered slightly conductive to eliminate electrostatic charges is placed inside the enclosure 41. These charges flow to ground through the lifting system, which is itself connected to the protection casings of the enclosure as depicted in FIG. 15. The assembling of the two casings also creates an electrostatic and electromagnetic screen to protect the object inside the enclosure from this type of perturbation.

Casings 42 and 43 are, for example, made of plastic that is strongly charged with conductive fibers to make them very conductive.

Casings 42 and 43 comprise holes that permit the passage of location blocks. The two casings surrounding the enclosure are assembled together, for example with screws 62. Their role is to protect the enclosure. Slots are provided in the casings to receive the bayonet mechanism 50, the assembly lock 52, and advantageously a module identification tag and/or a rewritable radio-frequency tag that can memorize, for example, object identification 10 and/or information on the progress of the process applied to the object in the enclosure.

The assembling device 45 makes possible to assemble the various modules as well as the electrical ground connection to enable the flow of electrostatic charges accumulated on the flat objects and in the enclosures. This assembling device comprises slots where sensors can be placed.

Depending on the nature of the module to which they belong, shaft elements receive a seal 44 at both ends (in the case of an intermediate module), a seal 44 at one end and a connector 38 at the other end (in the case of a terminal module), or a connector 38 at both ends (in the case of a module that is a unit assembly).

Devices 48 for lifting flat objects and distributing gas within the enclosure are mounted in the enclosure.

Of course, maneuver bayonets allow for reverse operations to be carried out.

Advantageously, the enclosure comprises various sensors. For example a pressure sensor or an oxygen presence sensor, located in slots provided to this end, for example slot 64.

Door 49 keeps module 40 sealed by the pressure of a seal that may be plane or "toggled", solid with the door on an appropriate shape, for example knife-shaped. Pressure is maintained by maneuver bayonets 50 fitted with a retracting spring.

Figure 18:
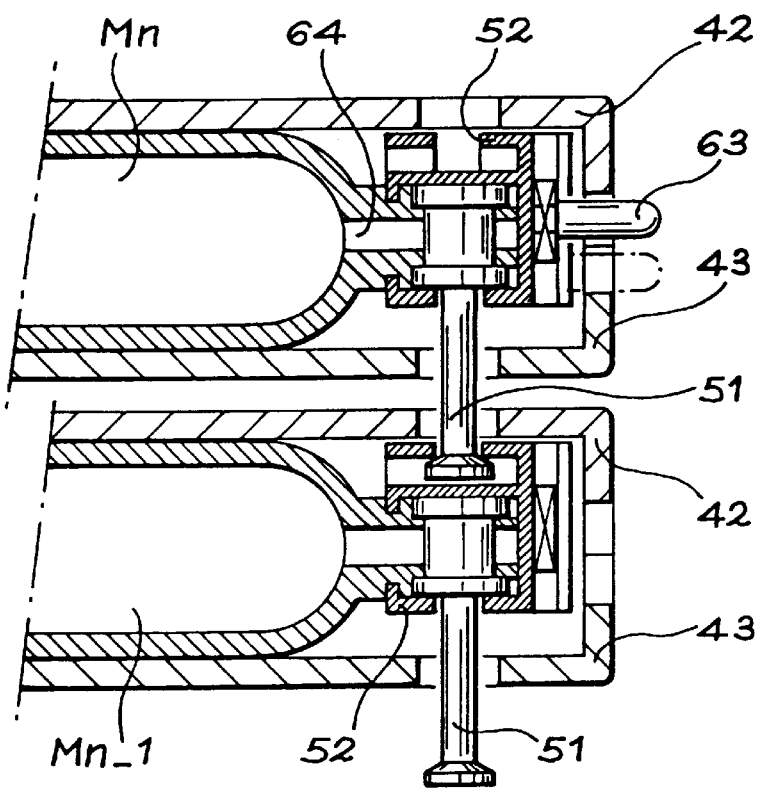

As represented in FIGS. 14, 17 and 18, the assembling device 45 comprises a stud 51 mounted on a protrusion on enclosure 41. This protrusion has two grooves in which lock 52 can be moved to realize the assembling of the enclosures of two successive modules $M_{n+1}$ and $M_n$. Module $M_{n+1}$ is locked by activating module $M_n$ since $M_n$ is already blocked.

In FIG. 18, the upper module is the top terminal module Mn of an assembly and comprises a lever 63 that permits the unlocking of an assembly $M_{n+1}$ which has been superimposed on it. Intermediate modules or lower modules $M_{n-1}$, etc. that make up an assembly cannot be unlocked and do not have such a lever because it has been removed so they can make up such an assembly.

As represented in FIG. 14, door 49 is provided with a spring 54 that blocks the flat object 10.

A device 48 permitting the lifting of the flat object 10, depicted in FIGS. 14, 16, 19 and 20 is in the shape of a tube, obtained for example, from a solid rod in which a tapering opening is bored. This opening is punctured with holes 56. The object 10 is blocked by two stops holding it in place, positioned at the first ends of the two devices 48 and by the door and its locking spring.

The plug 57 and the spring 58 keep the device 48 in its slot. A slot 59 is provided in box 41 to block the tube 55.

The tube may be made of a material like the conductive PEEK type plastic that makes it possible to maintain the potential of the object grounded and direct the electrostatic charges towards the conductive casings 42 and 43 which are themselves maintained at grounded. Plug 57 and spring 58 maintain electric contact.

This device 48 is also used for distributing the gas within the enclosure.

In a preferred embodiment of the invention, cells may be made in plastic resistant to temperatures up to about 120° C. These can then be used to obtain a process for treating objects. For example, they can be used to stabilize an ionic implantation process: by monitoring the temperature of nitrogen injected, the cooling of the objects can be perfectly monitored.

Advantageously, enclosure 41 may be made of a material that is compatible with the specifications of the confined object.

For silicon wafers, this enclosure must be in plastic to be light. For applications where it is not necessary to see the wafers, the enclosure may be made of polycarbonate materials charged with conductive fibers to allow the flow of electrostatic charges.

For applications where it is necessary to maintain transparence and where environmental conditions are very severe in terms of degassing, polycarbonate lined with a barrier layer of less than one micrometer of silica, which has been suitably doped with silicon to make it slightly conductive, may be used without a loss in transparence.

The two casings 42 and 43 that constitute the box for protecting and maintaining the enclosure may be made of conductive plastic.

The electrostatic charges created on the internal faces of the enclosure and those conveyed by the object will be evacuated towards the conductor box by the lifting mechanism (48). This mechanism is itself conductive because of the contact between the spring (58) and the plug (57). Lock 52, connected to the casing via a spring, will evacuate the charges on the lock of the underlying module via the conductor stud 51. This will thereby create a "ground" chain up to the conducting plate on which the mechanism of the invention has been placed. This plate is connected to the ground, as represented in FIG. 15.

Figure 21:
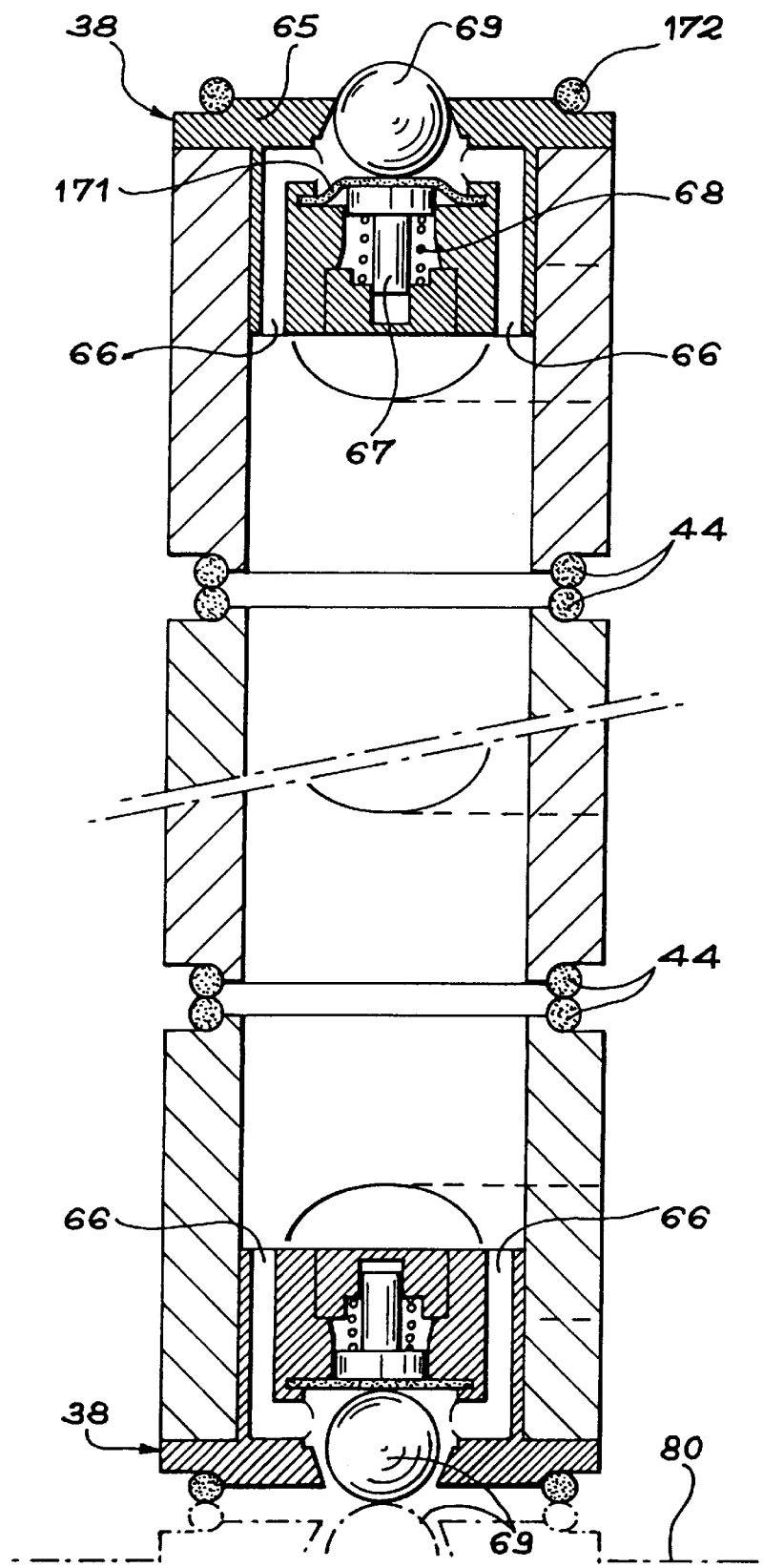
FIG. 21 depicts a shaft element provided with two connectors that permit the connection with neighboring elements.

A self-sealing connector 38, depicted in FIG. 21, permits the inner volumes of the enclosures, where the ends are not connected, to be hermetically sealed. It also ensures the continuous distribution of gas to the connected parts.

A connector of type 38 comprises a body 65, provided with two channels 66 that allow for the passage of gas, the interior of which contains a push-button system 67, activated by a spring 68. The push-button system can push back a ball placed in a receptacle with a flange 70. A diaphragm 171 for protecting the system from contamination by the spring is placed between the push-button system 67 and the ball 69. An O-ring 172 is placed on the outer periphery of this body.

When two connectors of this type are linked to each other, they are sealed by two seals and the pressure of the two balls pushed together permits the connection of the gas passage channels. In FIG. 21 the self-sealing connector 38 located at the bottom is represented as connected to another connector of the same kind placed on a plate 80 marked in a dot-and-dash pattern.

Figure 24:
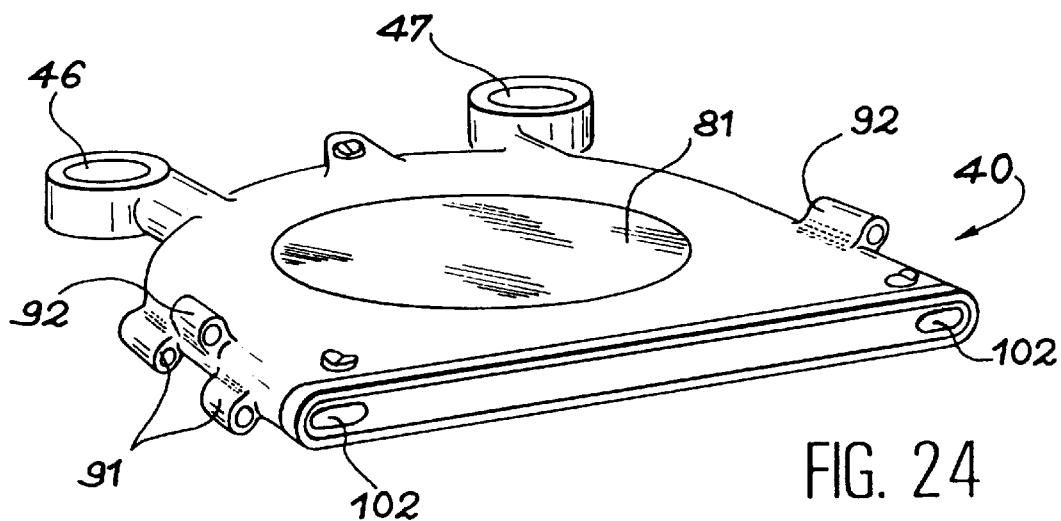
FIGS. 24 to 38 depict various embodiments of the device of the invention.

In another embodiment, depicted in FIG. 24, the base module 40 is in a single transparent piece to enable the flat object 10 inside said module to be identified and observed. This piece can be totally transparent, or at least transparent in zones 81 facing the flat object 10. FIG. 24 represents such a minimum zone 81.

Thus, flat objects, the silicon wafer 10 in module 40 for example, can be observed and identified without having to be removed. In other words, they can be maintained in the ultra-pure and/or ultraclean environment.

Figure 25:
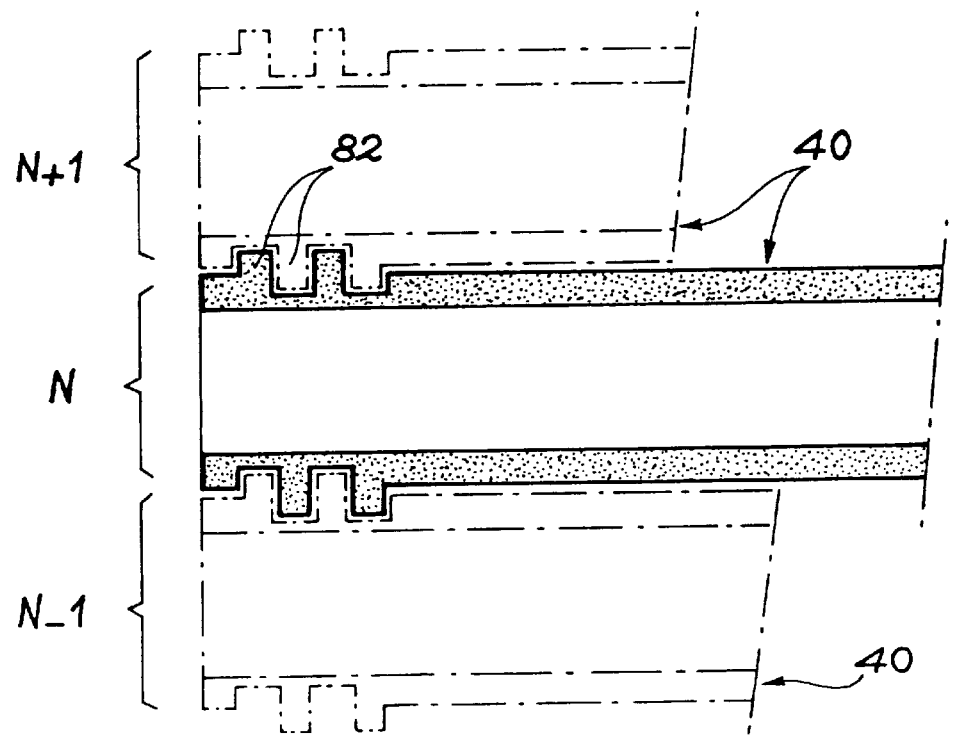

As depicted in FIG. 25, the special ribbing 82 of "male-female" type can improve the rigidity of module 40, on the "nose" of the module as well as at the gas inlet shafts.

By way of example, the non transparent and very rigid part may be made of charged fiberglass polycarbonate or silica needle, and the transparent part of polycarbonate. Thereto, transparent plates welded on a frame or forced with a seal or a sandwich molding are used.

Figure 26:
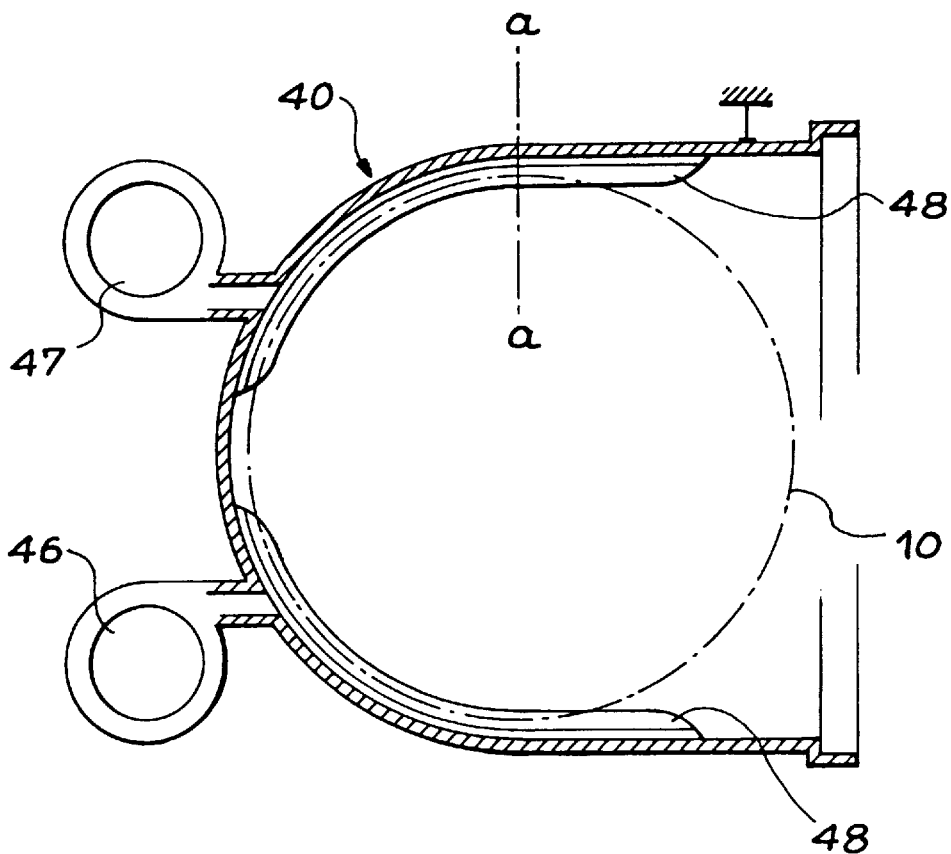
Figure 27:
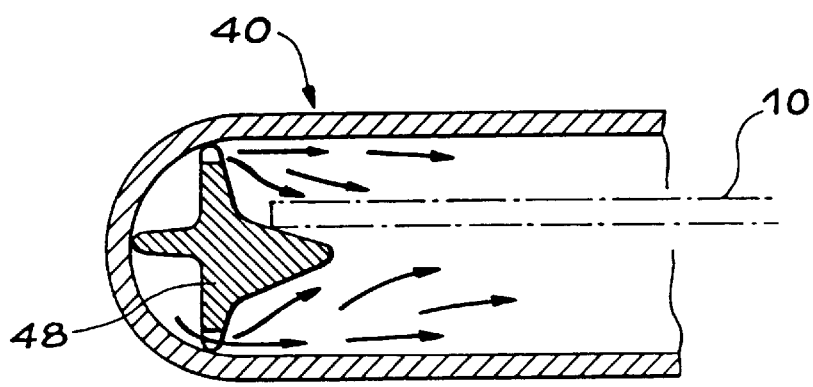
Figure 28:
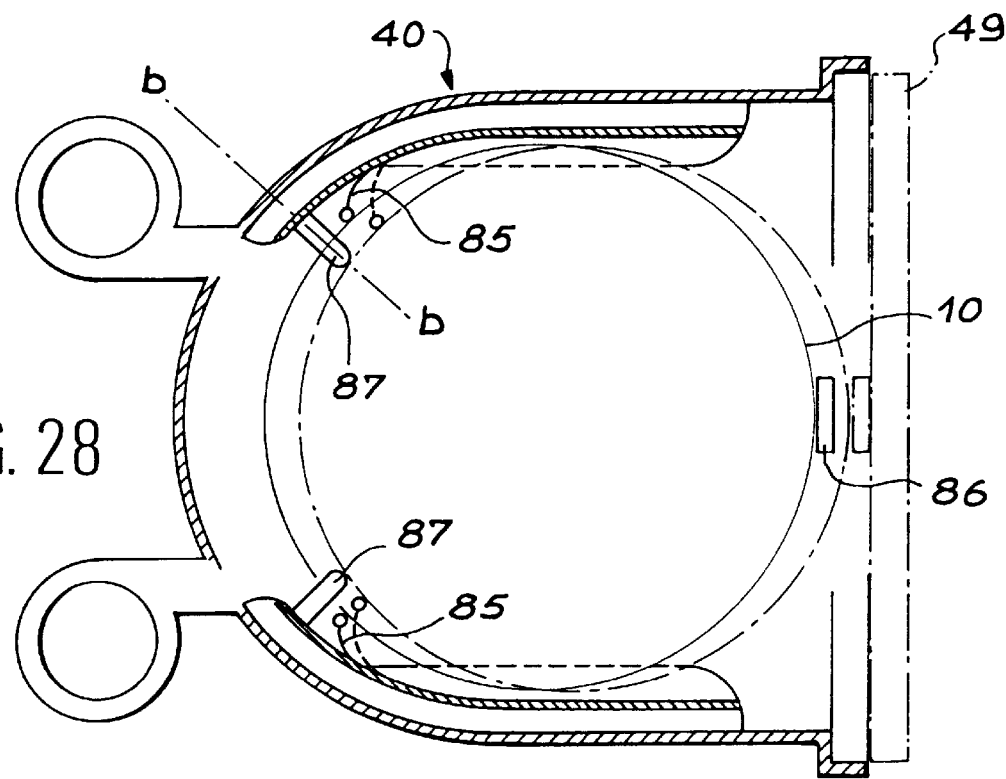

In another embodiment, as depicted in FIGS. 26 to 29, modifications are made in the shape of the devices 48 for lifting flat objects 10 and the gas distribution mode. FIG. 27 depicts a section a—a of FIG. 26 and FIG. 29A depicts a section b—b of FIG. 28.

As depicted in FIG. 27, each device 48, located on each side of the module 40, has an approximately T-shaped section allowing for a flow of gas that is horizontal and transverse to the flat object. This is because the inner part of the module 40 and each device 48 constitute a plenum chamber that enables the gas to be distributed within the module by an injection device 48 and evacuated by an exhaust device 48.

Each device 48 remains conductive to evacuate charges and to maintain the flat object 10 at an electric potential that is close to ground.

Figure 29B:
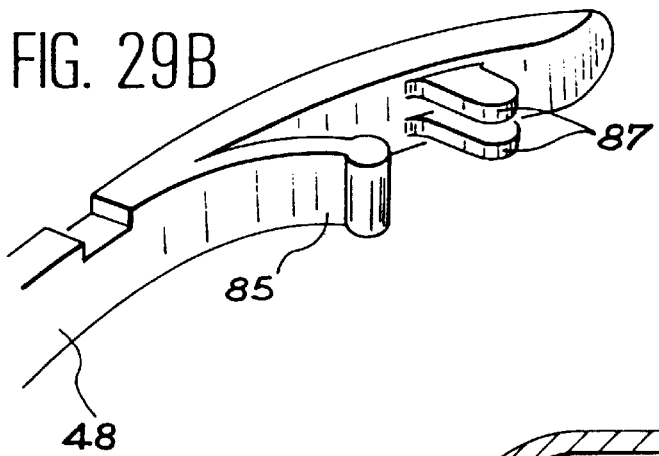
Figure 29A:
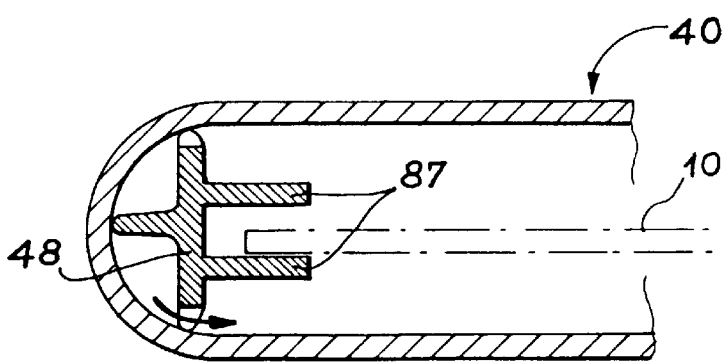

The blocking function of the flat object 10 is ensured by a wedge-shaped rigid positioning system 86 solid with the door 49. The blocking effect, the positioning of the flat object 10, the opening or closing of the door, are ensured by two spring stops 85 and two fork-shaped elements 87 solid with the lifting system 48 as depicted in FIG. 29B. This prevents the flat object 10 from moving inside the module 40.

When the door 49 is open, the spring stops 85 push the flat object 10 slightly forward to release elements 87 thereby enabling the flat object 10 to be picked up by a prehensile robot.

Figure 30:
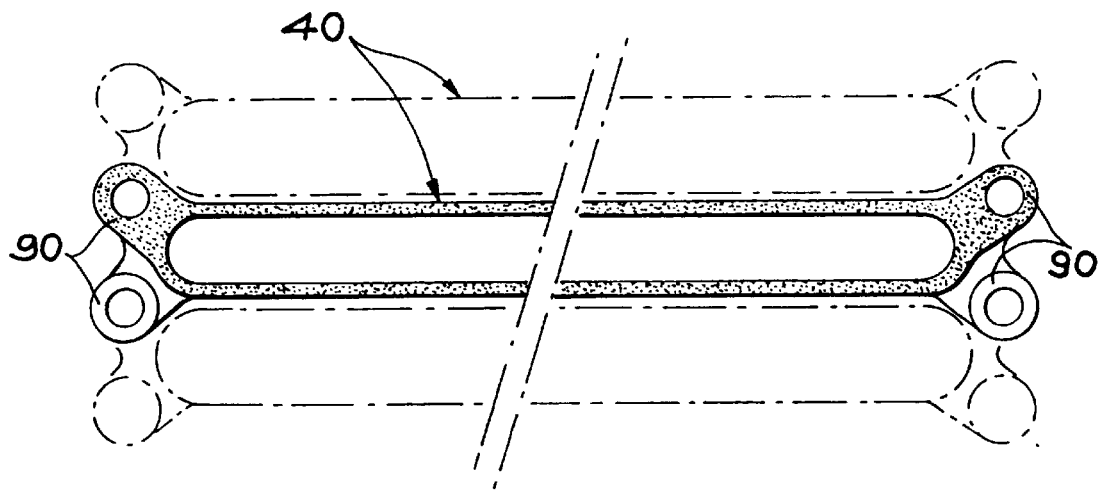
Figure 31:
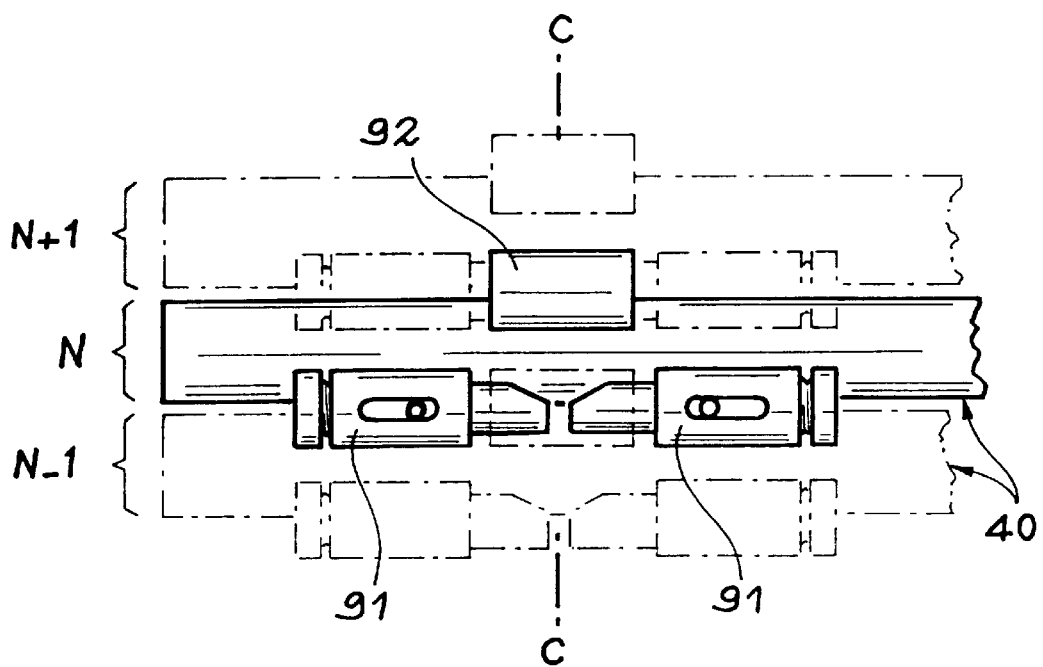

In another embodiment, the system of association of the modules 40, as depicted in FIG. 24, is obtained by using complementary forms 90 in the shape of ear-pads. This is depicted in FIGS. 30 and 31, with FIG. 30 representing a section, c—c of FIG. 31. Each module 40 comprises, on each side, one upper ear-pad 92 hereafter also referred to as the upper lug and two lower ear-pads 91. The ear-pads 91 hereafter also referred to as the lower lug and 92, the functions of which can be inverted, are built onto each of the modules 40 to enable them to be stacked and to match the two lower ear-pads 91 of a module N with the upper complementary ear-pad 92 of a module N−1.

A mechanism housed in the lower ear-pads 91 enable the modules 40 to be locked together and also to stack said modules 40 tightly on top of each other. The relative position is thus obtained as well as the pressure needed to make sure that the various shaft elements that have been stacked are airtight.

Figure 32:
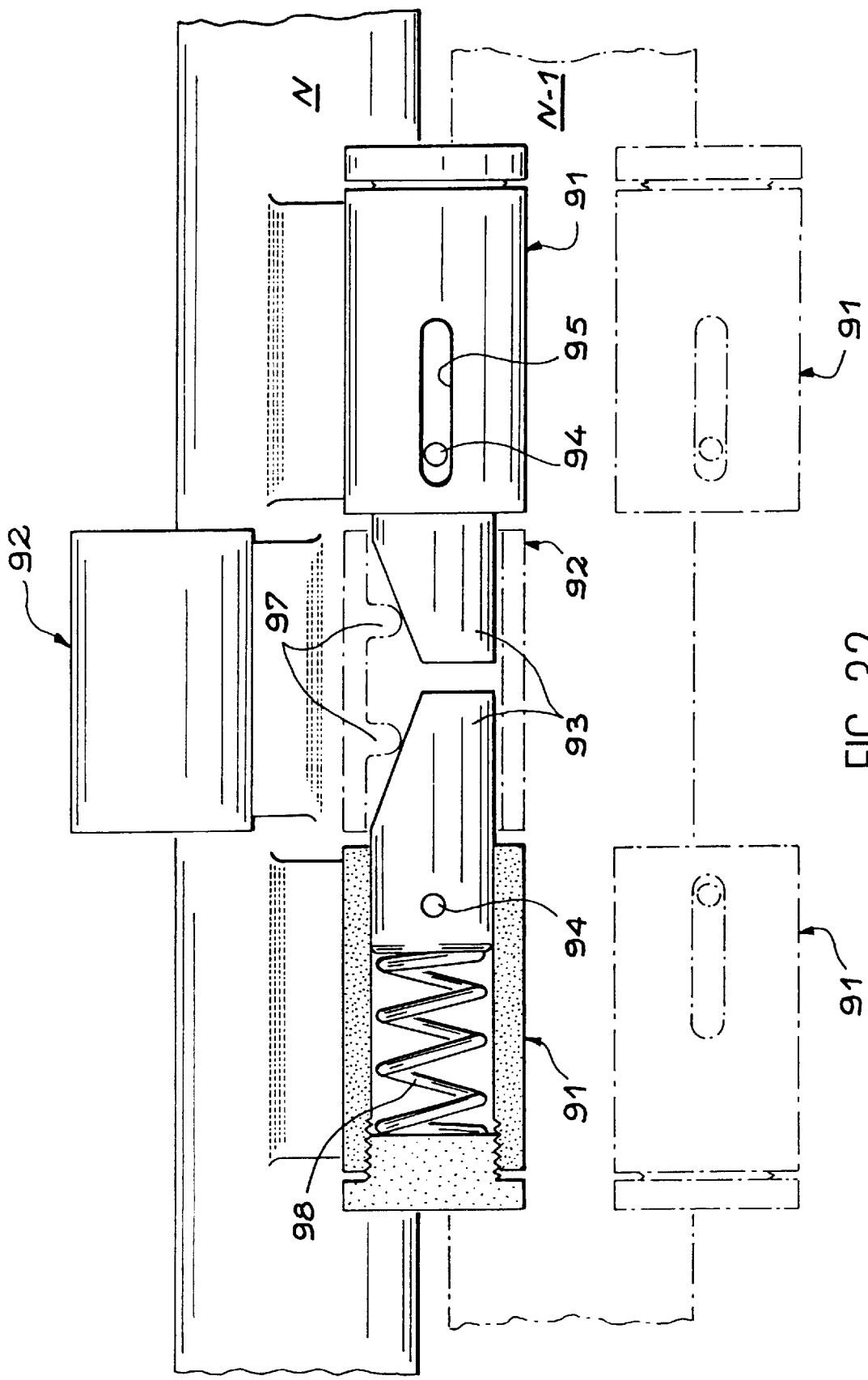

FIG. 32 depicts the mechanisms that are housed in the two lower ear-pads 91 of a module 40 of row N as well as their operating mode.

Two pins 93 having a beveled side enter the upper ear-pad 92 of module 40 of row N−1. The upper ear-pad has two wedges 97 that react with the beveled edges of the pins 93 and transform the pressure exerted on the pins 93 by the two springs 98 into a force that tends to block the module 40 (N) on the module 40 (N−1).

Handling fingers 94, solid with the pins 93 and moving in a slot 95 in the lower ear-pads 91, enable the pins to be maneuvered so as to separate the upper module N from the lower module N−1.

Ear-pads 91 and 92 may either be mounted on module 40 or be part of the module.

Figure 34:
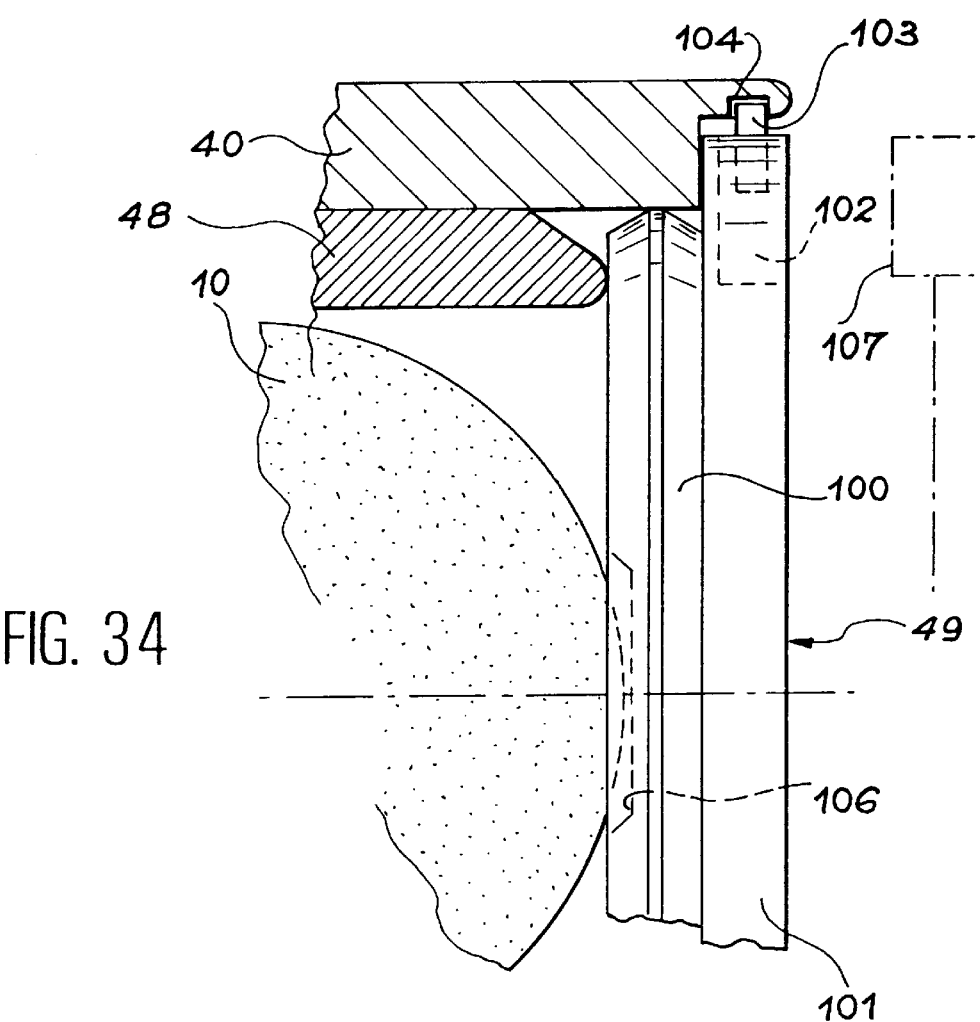
Figure 33:
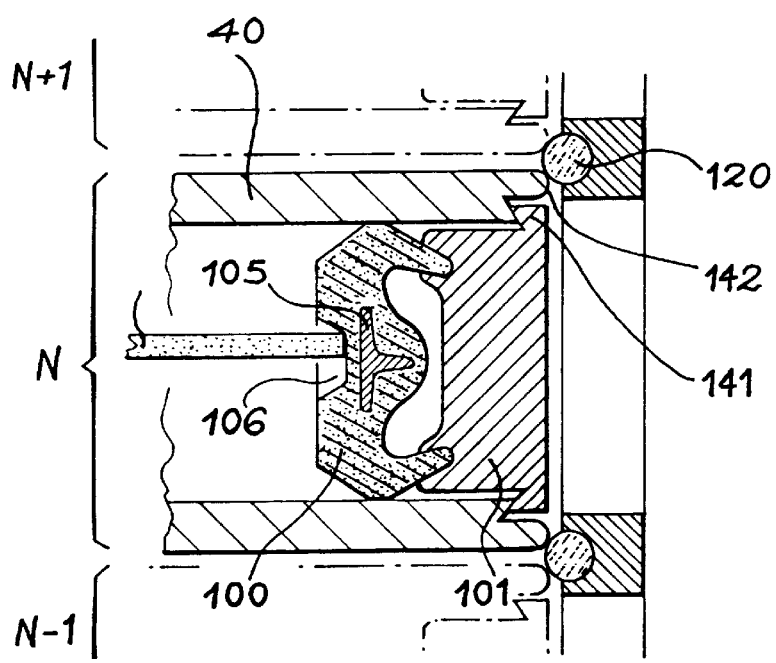

In another embodiment depicted in FIGS. 33 and 34, the door 49 of module 40 is composed of three parts: a seal 100, a body 101 on which the seal is mounted and a locking device 102 to connect the door with module 40. The seal 100 abuts on the lifting devices 48 of the flat objects 10 located on each side of the module 40. Pressure on the seal 100 is provided by pressure on the body of the door 49 when this door is closed. This pressure is maintained by two tumblers 103 from the locking mechanism 102 that comes to fit in two slots 104 on both sides of the "nose" of the module 40.

The pressure on the toggle seal 100 (see FIG. 33) results in the widening of the seal on its entire perimeter thereby distributing sufficient force on the seal to make it completely airtight.

Various materials can be used for this seal 100: vitton, kalrez, chemraz, etc.

The seal 100 is sheathed with a sheath 105 the rigidity of which is calculated to suitably distribute the pressure of the seal 100 on the entire perimeter of the "nose" of the module 40.

A wedge-shaped slot 106 in the seal 100 enables the flat object 10 to be blocked inside the module. This slot 106 has the same function as the "wedge" 86 described above, which is solid with the door 49.

Special forms 161 and 162 are made in the "nose" of the module 40 to enable form 162 to seal the module 40 hermetically from the outside by means of an oblong seal 120, and to enable form 161 to a receive a door body 101 fitted with a complementary form (161) that guards against variations in shape of the nose of module 40.

The locking device 102 is controlled and activated by a complementary mechanism 107 solid with the inner door by an opening flange.

The association of mechanisms 102 and 107 permit the unlocking of door 49 of module 40 so as to release the door of the module. With the same action, mechanisms 102 and 107 are associated together to enable the removal of door 49 of module 40.

When module 40 is closed a built-in sensor of mechanism 107 permit door 49 to be re-locked on its module 40 and mechanisms 102 and 107 to be released so the flange may be removed.

Figure 35A:
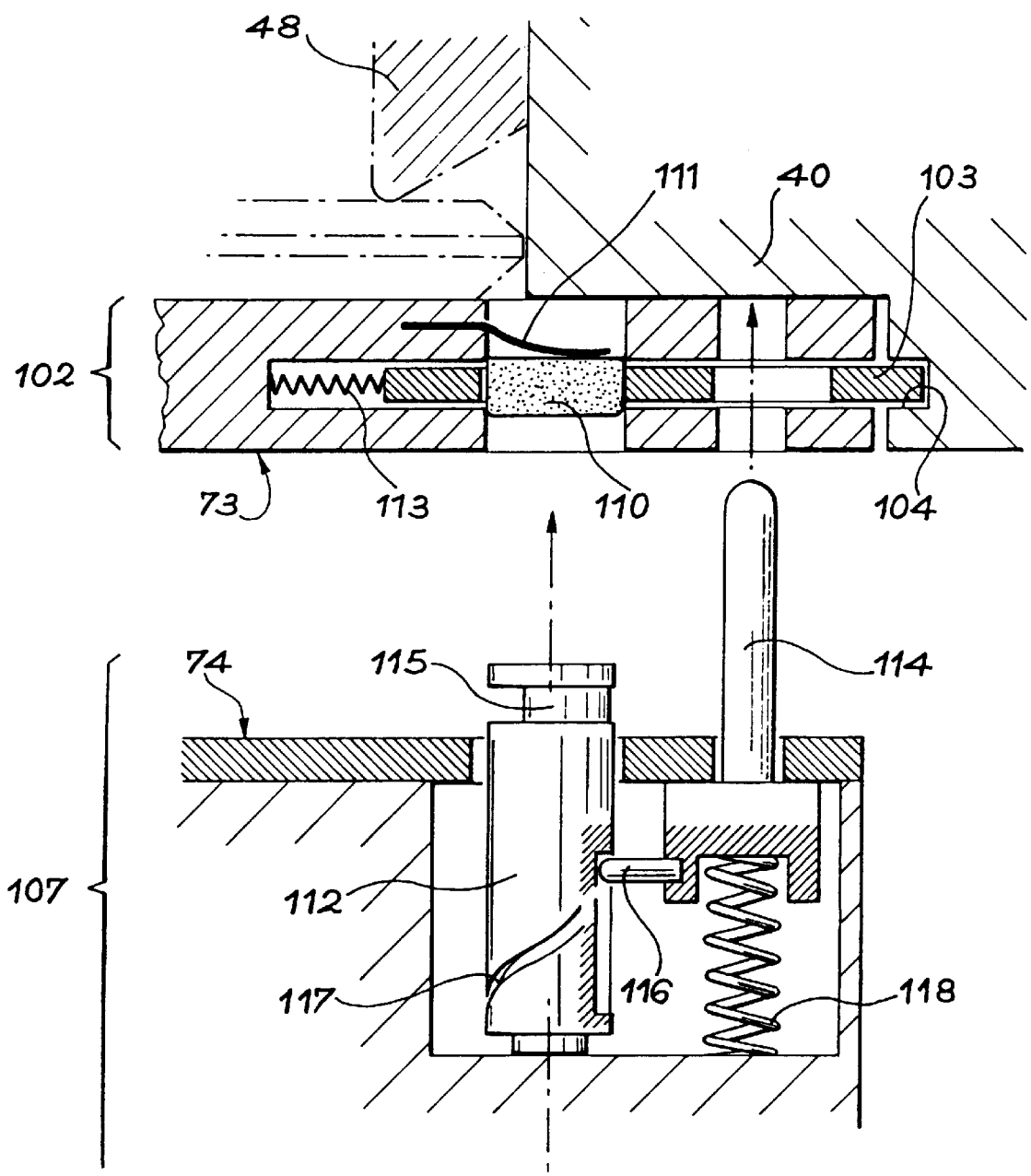

FIG. 35A is a section of the locking mechanism 102 between door 73 of a cell and mechanism 107 of the coupling system of the present invention, and mechanism 107 which is complementary to the mechanism installed in the door. The position of the mechanism as represented in this figure corresponds to its position when the two mechanisms 102 and 107 are separated.

Figure 35B:
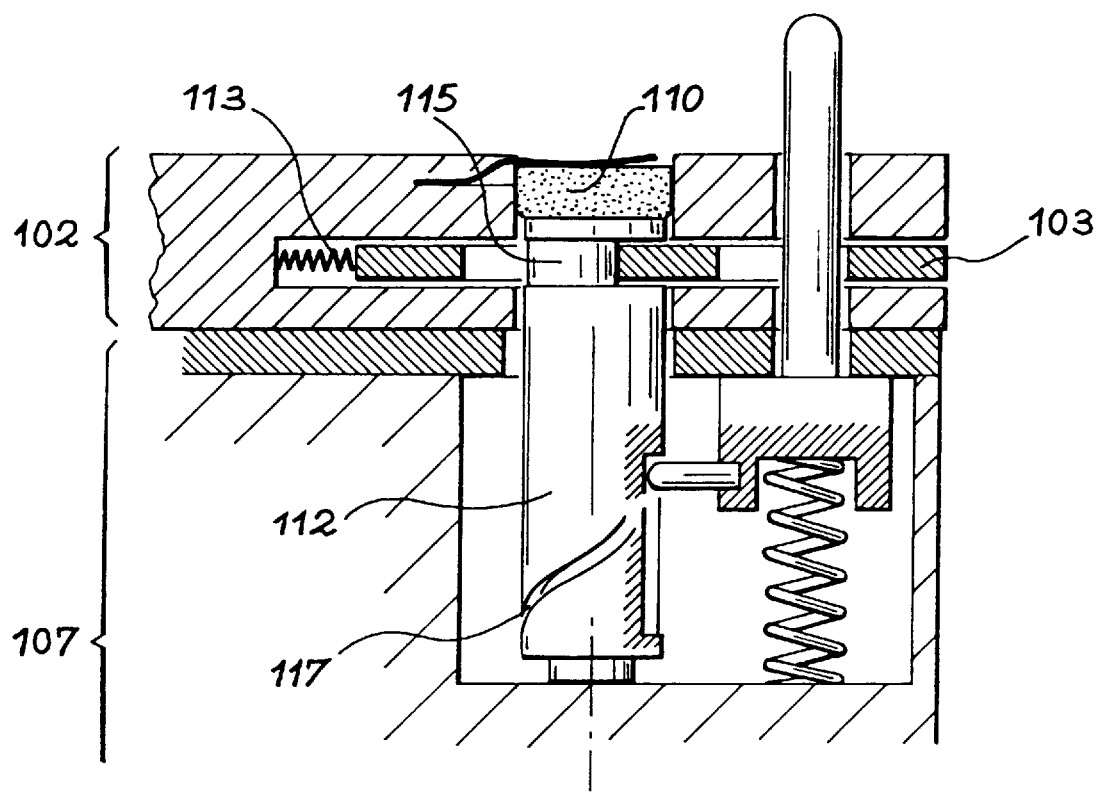

FIG. 35B is a section of the locking mechanism when the cell door is coupled with the flange mechanism to enable the retraction of the cell door into the flange.

Figure 36:
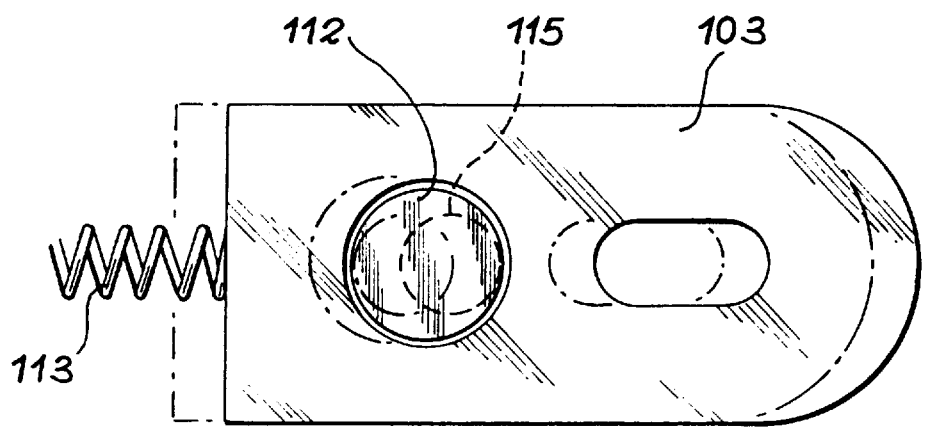

FIG. 36 represents the two positions of tumbler 103. The full line represents the position when door 73 is locked and the dotted line the position when door 73 is released. This latter position also corresponds to the locking position on door 74.

As depicted on FIGS. 35 and 36, an example of mechanism 102, enabling door 73 to be locked so as to close the corresponding cell by means of the two tumblers 103 that are housed in two corresponding slots 104, is controlled and activated by a complementary mechanism 107 that is solid with door 74 of opening flange 70.

The association of mechanisms 102 and 107 enables door 73 that closes the cell to be unlocked thereby releasing the cell. With the same action, mechanisms 102 and 107 are associated together to enable the removal of door 73.

When the cell is closed, a sensor 114 that is solid with mechanism 107 enables door 73 to be locked again on the cell and to release mechanisms 102 and 107 so as to remove flange 70.

A tumbler 103, mounted on the body of the door, comprises two openings: a first opening that can let through sensor 114, solid with mechanism 107, and a second one in which plug 110 comes to rest. Plug 110 is held in place by a spring 111. The tumbler is solid a return spring 113.

Mechanism 107 comprises a sensor 114 mounted on a spring 118, and a mobile rotating piece, or hammer 112 comprising a cam-shaped groove 117 on its periphery and an eccentric 115 on its upper surface. The sensor 114 and the hammer 112 are mounted in parallel so that a pin 116 solid with the base of sensor 114 comes to rest in the groove. Pressing on the sensor 114 will permit the hammer 112 to rotate through 180°.

Tumbler 103, mounted in the body of door 73, keeps this door locked to close the cell and ensures the connection of door 73 with door 74 of the flange. This enables the door 73 to be removed thereby giving access to object 10.

Tumbler 103 is held in the locked position with the plug 110 held in place by spring 111.

At the time of contact, piece 112 of mechanism 107 comes to strike the plug 110 which recoils and releases tumbler 103 which can be removed from its locked position by spring 113.

Sensor 114 mounted on spring 118 goes through mechanism 102 and comes to press on the body of module 40. As it recoils, sensor 114 drives the hammer into rotation under the effect of the cam system 116–117. In doing so, the eccentric 115 pivots through 180° and enables tumbler 103 to go into the unlocked position. Simultaneously, the eccentric locks the hammer 112 with tumbler 103 thereby connecting mechanisms 102 and 107, and hence doors 73 and 74.

The head of piece 112 is fitted with an eccentric groove 117 which, under the impetus of the 180° rotation induced by the recoil of the sensor, releases tumbler 103. The tumbler is pulled by spring 113 and withdraws from the housing 104 thereby unlocking door 73 of the cell. In doing so, tumbler 103 engages into the eccentric groove to lock door 73 on mechanism 107. This enables the door to retract. This situation is depicted in FIG. 35B.

To close a cell after the transfer of object 10 and to release the cell from the flange in order to reach other cells, the internal mechanism of the flange brings the assembly comprising door 73 and door 74 to the box-flange contact position. This is represented in FIG. 35B.

Sensor 114 comes again to rest on the box of the cell where it is driven back, fastening with a 180° rotation, piece 112 the eccentric groove of which will push tumbler 103 back into the locking position of door 73. In this position, door 73 can be separated from door 74, since piece 112 is removed from tumbler 103.

At the same time as mechanism 107 is removed, plug 110, pushed back by spring 111, takes the place of piece 112, locking tumbler 103 in place, in the position where door 73 and box 40 are connected.

When door 74 carries door 73 back to close the cell, sensor 114 comes into contact with box 40 of the cell and recoils.

This recoil movement gradually takes the hammer 112 through a 180° rotation, and this brings back tumbler 103 to the locked position as a result of the combined rotation of eccentric 115 of hammer 112.

Door 74 can then be removed. The locking plug 110 replaces hammer 112 to maintain tumbler 103 in the locked position.

Figure 37:
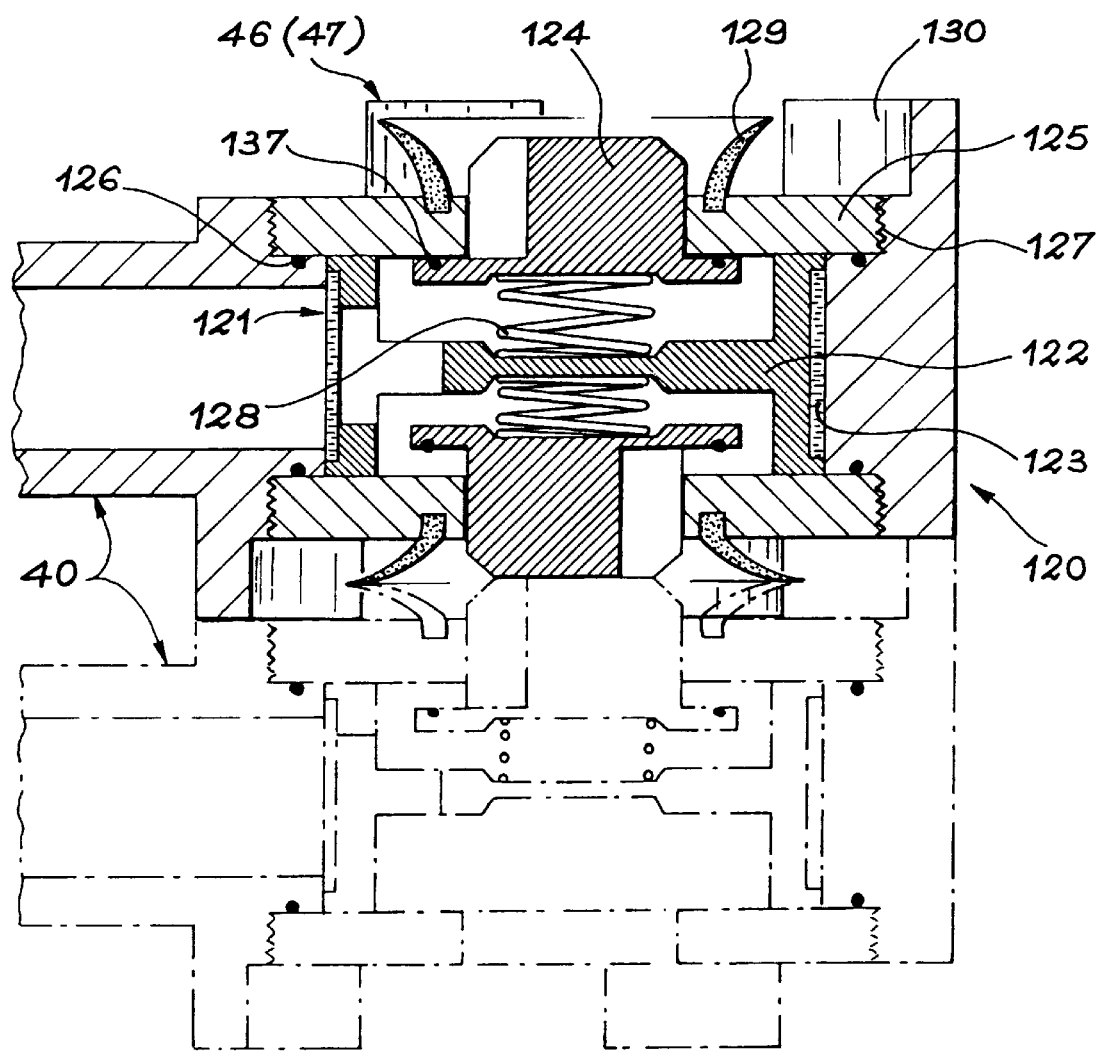

In another embodiment, depicted in FIG. 37, the self-sealing connector 38, depicted in FIG. 21, is altered so as to mount it on both sides of the shaft element and also to integrate a filtering function for particles that may be released during the connection and disconnection of modules 40.

Each shaft element 46 or 47 of the module 40, as depicted in FIG. 14 in particular, can receive one or two connectors 120 depending on the position of module 40 in a stack 39, depicted for example in FIG. 13. If module 40 is the terminal module of stack 39, then it receives a single connector 120, placed on the outer side of the stack. In the case where the stack is composed of a single module 40, each shaft element receives two connectors 120 located on both sides of the shaft element 46 or 47. FIG. 37 represents a configuration of the latter type associated with another assembly as depicted in FIG. 13 for example.

Figure 38:
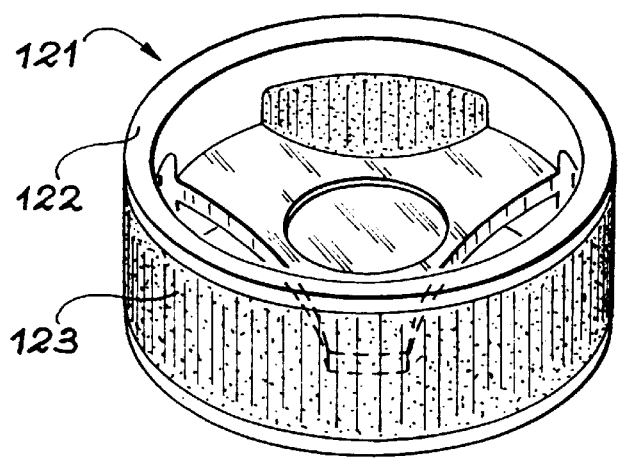

The filtering element may consist of a central ring 121, depicted in FIG. 38, composed of a rigid ring 122, made of polycarbon for example. A filtering diaphragm 123 is mounted on the ring. The forms of these pieces are arranged to allow for the passage of gas through the connector and the supply of gas within the module 40 with a particle-free gas filter.

Connectors 120 are mounted on each side of the filtering element 121. Each connector 120 is composed of a three-sided flap 124, guided by a end-shield 125 made airtight by a seal 126 on the shaft element of module 40.

The end-shield 125 is maintained under pressure by forms 127, which may be threaded for example. The flap 124 seals the opening of the connector 120, when the connector is not connected, via the pressure of a spring 128 on a seal 137. A lip seal 129 is used to ensure tightness between the shaft elements of an assembly 39.

There are complementary forms 130 on both sides of the shaft element to prevent the flap 124 from being overtaxed when module 40 or assembly 39 is placed on the working zone, which ensures that said forms are airtight.

When two modules 40 are placed on top of each other, as depicted in FIG. 37, the two flaps 124, which are connected, are pushed back and the seals 129 form an "airtight basin" between the flaps. This "basin" is purged at the time of connection, before the modules are placed in their final position. Gas can flow from one stage to another with because of the adapted forms on the flaps 124 and supply modules 40 with filtered gas.

The device of the invention, as defined above, enables the creation of an uninterrupted "chain of cleanliness and purity" between the storage, transportation and exchange of flat objects 10 with processing machines (even those machines that run in a vacuum environment).

The device is perfectly airtight during the transportation phases. To this end, each cell is tightly closed by an independent door and all gas inlets are blocked.

During the storage of objects in the cells, the device is continuously purged by an appropriate gas (nitrogen for example) to dilute the volatile contaminants that are released. The gas distribution in the various cells is provided by the "shaft" structure.

Thus, the device of the present invention corresponds to a conventional basket for transportation and storage of semi-conductor wafers that has been transformed as little as possible and given two additional features:

The possibility of confining flat objects individually in an "inert" environment. The various enclosures are connected to each other by two "shafts" that supply and extract inert gases.

The possibility of making assemblies of standard sizes (for example 1, 4, 7, and 13) by the rigid and fixed connection of base modules using an assembling device.

These assemblies and/or base modules are positioned with respect to each other with the help of a marking system. In the case where assemblies are produced from base modules as represented in FIG. 11, the various "shaft" elements are made airtight with seals kept under pressure by the assembling system. These various assemblies may be associated and separated manually or automatically to provide them with the flexibility needed to optimize the specific uses of machines.

When the assemblies are connected, the pitch between the position of objects within the enclosures is observed.

The assembling/disassembling system, which ensures a rigid connection between assemblies, may be done manually or automatically.

Figure 22:
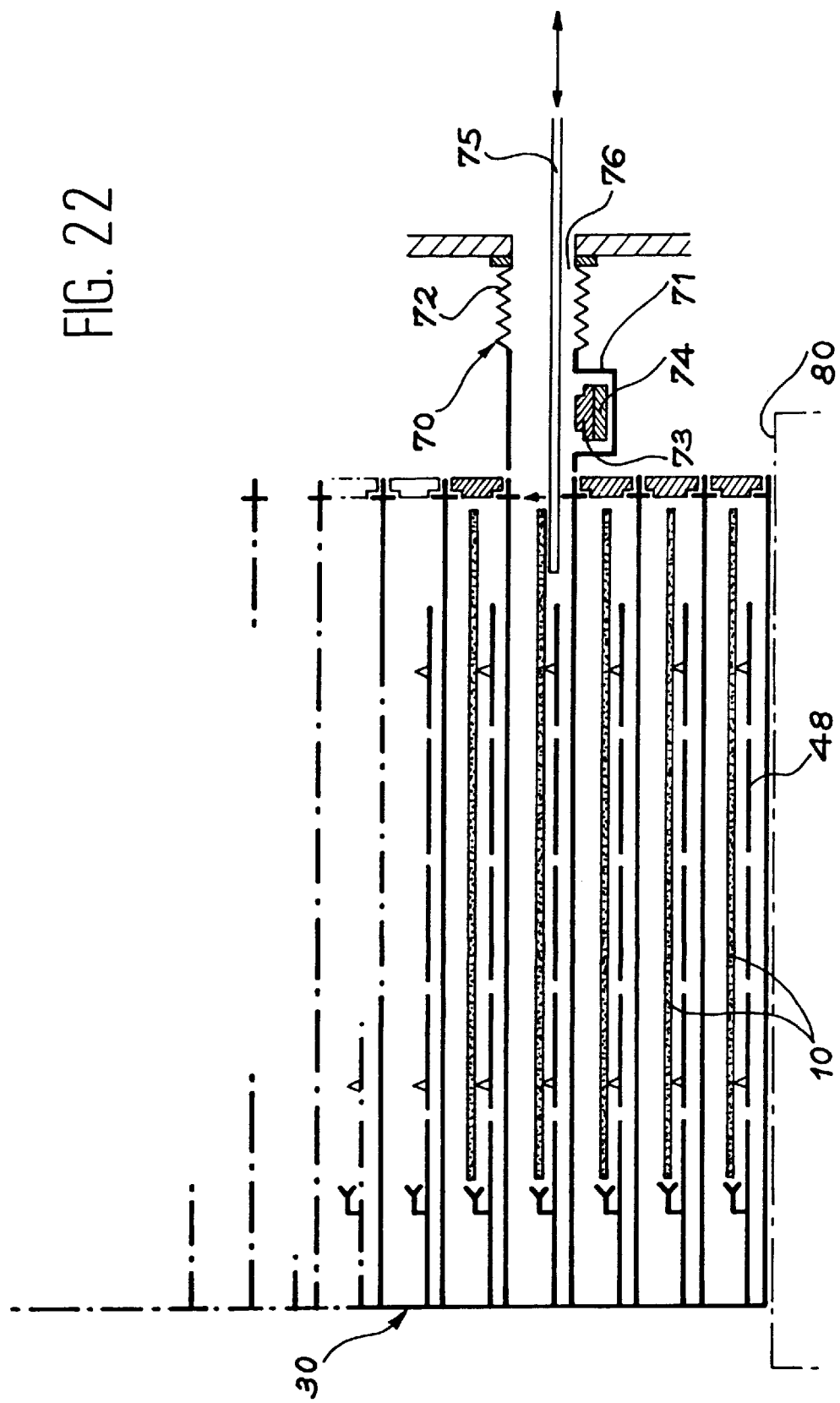
FIG. 22 depicts the process, according to the invention, for transferring of flat objects from the device of the invention to a processing machine.
Figure 23:
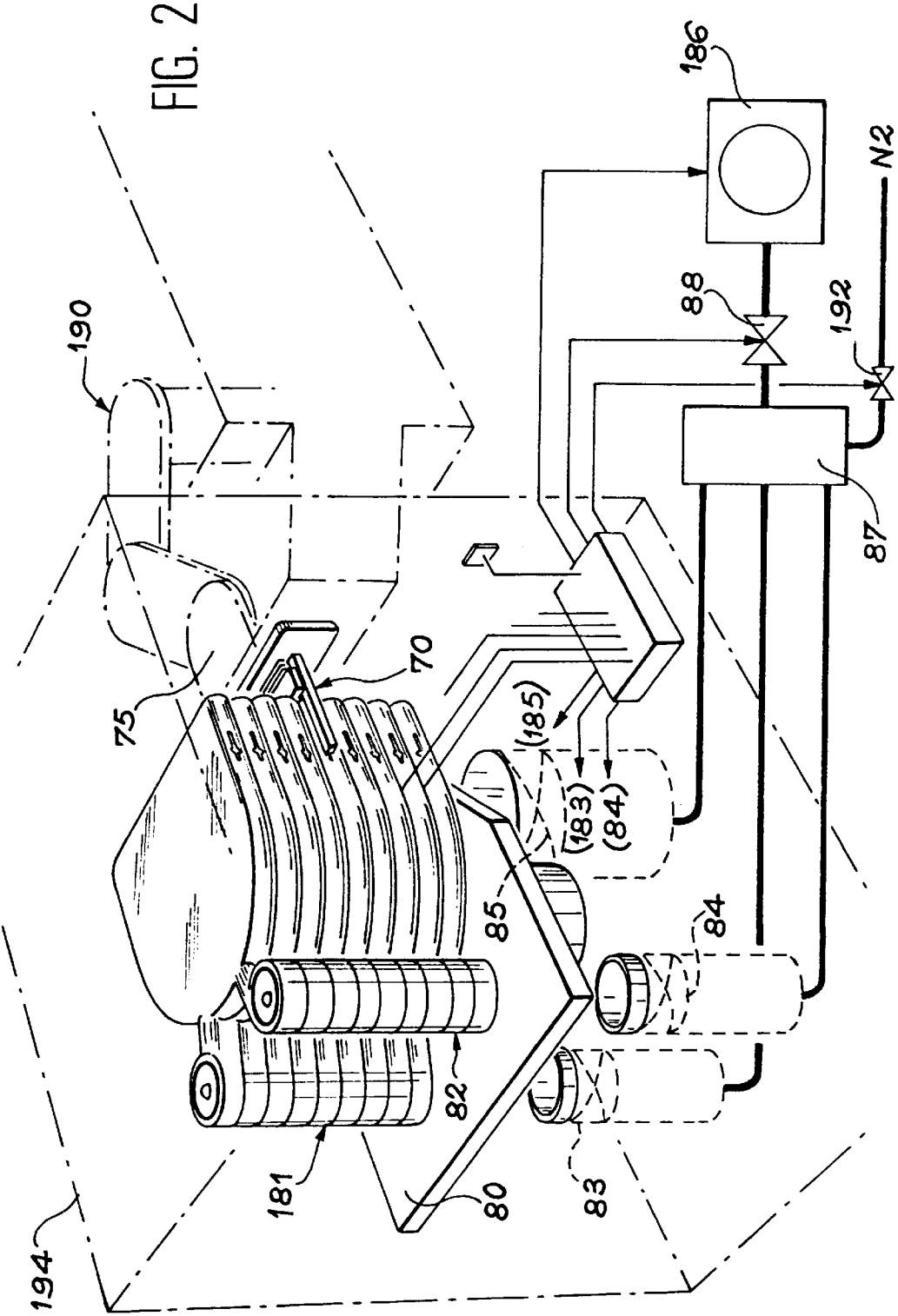
FIG. 23 depicts a system for creating a vacuum in the device according to the invention.

During the interfacing with processing machines, the cassette is positioned on a plate 80 solid with the machine and a special flange 70 depicted in FIGS. 22 and 23 enables the airtight connection with the cells.

To implement the flange 70, the device of the invention is placed on plate 80 in such a way that each cell or module may be communicated with the considered processing machine by means of a flange 70 to form an airtight tunnel 76. The plate 80 is mounted on an indexer so as to address the various cells. Once in place, the flange 70 ensures the communication between a cell and the machine so a robot 190 fitted on the machine can transfer the object 10 in all directions. To establish an airtight link between the machine and the cell to be opened, this flange 70 comprising, in particular, a mobile jaw 71 closed by a door 74 that makes it possible to close the machine and bellows 72 is used.

The mobile jaw 71 is connected to the fixed part of the flange by the bellows 72 to carry out translation and to ensure airtightness with the machine.

In the cases of connections with "vacuum" equipment, a metallic bellows 72 is used.

The connecting flange comprises two ear-pad systems that are housed on each side of the module. They are transversely mobile so that a stop can fit into the module to keep it in place when the mobile jaw moves towards the module. Inside the ear-pad system there is a mechanism that permits the bayonets in the module to be activated to maneuver the door.

Flange 70 is fitted with a translation mechanism to enable the forward and backward motion of the mobile jaw 71. It is also fitted with another mechanism that engages the stops on both sides of the cell so that the mobile jaw 71 can exert a pressure on the cell to ensure airtightness without displacing the device of the invention.

Another mechanism enables the bayonets to be activated to ensure the transfer of cell door 73 onto door 74 of the mobile jaw 71 so that the door may be released to enable its retraction into the mobile jaw.

Finally, the mobile jaw 71 is fitted with a mechanism that enables the retraction of doors 73 and 74.

Advantageously "viewing" systems are fitted on the mobile jaw 71 to monitor the position of the cell to be opened before contact is made.

Other sensors make it possible to check the position of the robot's finger, or the object 10 when it is picked or dropped so that this operation is performed without generating particles (no friction). An array of photodiodes or CCD can make it possible to read the identification of object 10 in passing. The identification is generally written on the object's periphery.

Thus, contrary to devices of the prior art, in which the box is pushed towards the opening system and where the plate must move transversely as well as vertically, in this invention, the cassette is stationary and it is the mobile jaw of the connecting flange that abuts on the door of a cell.

The stops solid with a lateral ear-pad mechanism position themselves on both sides of each cell, thereby enabling the cassette to be kept in place when the cell considered is connected with the mobile jaw of the flange. This is done by exerting and maintaining enough pressure to make the connection airtight.

This flange 70 is fitted with means for opening the door of the cell 73 and door 74 that closes the machine in order to create an airtight communicating tunnel in which robot 190 of the machine may carry out the transfer of the object.

The interfacing device comprising an adapting flange fitted with a mobile jaw 71 is necessary to ensure that the object 10 continues to be protected during the exchange. This flange 70 is provided with means that enable both the opening and closing of doors 73 and 74 which close the cells containing the flat objects and also those that close the equipment side.

This interfacing device enables the transfer of flat objects 10, for example semiconductor wafers, between the transportation device of the invention (airtight and slightly pressurized, if necessary), having a lateral door and a limited number of cells each containing a flat object, and a processing machine where these objects will be subjected to special treatments (insulation, deposit of layers, etching of these layers, etc.) by using the pick-and-place robot inside the process machine.

This device is mounted on the machine so that the end effector 75 of its internal robot 190 can go through the flange of the interfacing device to fetch or place objects 10 in the cassette cells when the cassette is connected. The device of the invention is also positioned with respect to the machine so that this operation becomes possible with the use of plate 80.

When there is no connection, the interfacing flange provides an airtight sealing of the inner part of the machine with respect to the outside, or a vacuum sealing if the inner part of the machine is in a vacuum. In this situation, the device of the invention is released to load or unload the machine by substitution or indexation. It is also in this position that the various cells may be sequentially indexed.

The device of the invention is mounted on a plate 80 solid with an indexer that sequentially addresses the various cells when the mobile jaw is retracted.

Thus, to connect the device of the invention with the processing machine fitted with an interfacing device, it is necessary that the positioning of the device with respect to the machine and its internal robot be done with the appropriate tolerances. Once these initial conditions have been met, the interfacing device solid with the processing machine carries out the following steps, in a more precise manner to obtain a connection:

- precise positioning of the device of the invention on the plate of the machine;
- precise positioning of at least one cell in front of the mobile jaw 71 of flange 70;
- airtight connection between at least one cell of the device of the invention with the machine by moving the mobile jaw 71 of flange 70 by a translation mechanism interdependent with the flange 70;
- purging the dead volume between door 73 of the cell on door 74 of the mobile jaw 71;
- connecting the door 73 of the cell to door 74 of the mobile jaw 71, by activating the bayonets associated with the cell by a mechanism solid with the fixed face of the flange. The action on these bayonets also enables the two doors 73 and 74 to be firmly attached to each other;
- the simultaneous opening of the now interdependent doors 73 and 74 to trap contamination on the surface. This retraction, done by a mechanism that is attached to the mobile jaw 71 of the two doors inside the mobile jaw, releases a space that is large enough for the end member 75 of the internal robot 90 of the machine to pick up or place a flat object 10 in the cell (for example a silicon wafer).
- the transfer of the flat object 10 by the robot 90;
- insulating the cell and the machine from contamination. An influx of appropriate gas is injected through the mobile jaw 71 to insulate the inside of the enclosure from contamination to prevent the cells from being contaminated at the time of transfer of the flat object. However, in the case of vacuum equipment, there is no gas injection but a connection to the vacuum circuit;
- the simultaneous closing, by the mechanism in the flange, of the two doors 73 and 74 kept in contact. Once the position has been attained, door 74 of the mobile jaw seals the machine hermetically, while the door 73 of the cell does not seal the cell hermetically;
- reconditioning of the atmosphere of the cell before closing. In this position the purity of the envelope is reconditioned by injecting an appropriate gas. However, this operation is not performed for vacuum equipment;
- separation of the two doors 73 and 74 by activating the mechanism on the flange and the bayonets of the door 73 of the cell and the recoil of the cell door until the cell has been hermetically sealed;
- withdrawal of the mobile jaw 71 by activating the transfer mechanism solid with flange 70;
- the possibility of indexing to open another cell or to remove the device of the invention from the machine.

In another embodiment, there may be several interface devices (flange 70+jaw 71) arranged in parallel which may function simultaneously to create several "tunnels" among several cells and the processing machine.

In the device according to the invention, an object 10 is kept inside a cell without touching the upper and lower inner surfaces of the cell. Thus the air flow formed by the diffuser in FIGS. 16, 19 and 20 can completely surround the two sides of this object 10 thereby enabling the ventilation of the object and the perfect renewal of the atmosphere surrounding the object.

The space between the object 10 and the upper and lower surfaces of the internal volume of the cell must be large enough to make the air flow practically laminar (with the upper side) to enable an end effector 75 of a robot 90 to pass beneath the object in order to grasp it. A pick and place robot is suited to operations of this type and is compatible with the device according to the invention.

An airtight device confining the object 10 in an environment adapted to its processing or production is thereby obtained.

It is also possible to maintain various pressures within the device: a slight superpressure to ensure better protection during the transportation and storage of the flat object.

The invention enables the same features of interface with the processing machines as the transportation baskets that are traditionally used.

The device of the invention replaces the traditional basket on the process equipment. The principle and means of exchanging flat objects between the traditional basket and the processing machine are maintained.

For processing machines in which wafer exchange is performed under vacuum, the device of the invention is placed in an airlock just like a traditional basket.

To meet the required conditions of exchange between the objects in the airlock and the machine core, the pressure in the airlock is brought to the same level as the pressure in the machine.

In the device of the invention, a vacuum is thus created inside the cells by the two shafts at the same time that a vacuum is created in the airlock.

FIG. 23, shows the device of the invention placed on a vertically mobile plate 80. This plate 80 carrying the device of the invention is placed in a specific position that enables shafts 181 and 182 to be connected. The enclosures are emptied through the two shafts and the two valves 183 and 84 are controlled electrically, for example. Airlock 194 is linked to a valve 85. The valves 183, 84 and 185 are connected to at least one vacuum pump 86 via a pressure control circuit 187 and a valve 88 so as to simultaneously exhaust the air in the cells and airlock. Pressure sensors are placed to this end in the cells and in the airlock 192. A valve 192 also enables nitrogen to be supplied into the circuit 187.

Air is exhausted simultaneously from the various cells of the device and from the airlock in order to interface these machines whose processes are performed in a vacuum without breaking the clean chain and especially without the need for additional operations to remove the objects from the cells and to put them back into the airlock of the machine. The same vacuum level is thus created in the various cells, the airlock and the process machine. The procedure for. transferring the object can then be carried out according to the invention process.

The connection of the device of the invention, as described above, can then be carried out up so as to enable the object 10 to be picked and placed.

An adjustment system creates the vacuum with no difference in pressure that could have an adverse effect on the cells. When the process is over and before the cassette is removed from the airlock, the same system is used to raise atmospheric pressure by simultaneously injecting nitrogen into the airlock and the cells without disturbing the pressure balance. Thus the atmospheric pressure is raised simultaneously in the airlock and in the cells.

Thus, as regards the utilization of machines that use a vacuum process, the cassette of the invention is directly inserted into the exhausted airlock contrary to cassettes used in the prior art where the objects have to be transferred into a vacuum airlock before they enter the machine.

TABLE I

|  | Standard basket | Collective mini-environment | Individual mini-environment | Device of the Invention |
| --- | --- | --- | --- | --- |
| Purity: inerting: contaminants of the VOC type are reduced New needs | No | Possible | Yes | Yes |
| Continuity of the nitrogen protection chain | No | Difficult | Yes | Yes |
| Flexibility | No | No | Yes Not optimal for micro-electronic applications | Yes Optimal for micro-electronic applications |
| Vacuum equipment interfacing | Directly into the airlock | Transfer of wafers | Transfer of wafers | Directly into the airlock simultaneous vacuum reduction |
| Equipment interfacing | Direct | Direct after opening Interface system required | Direct after opening Interface system required | Direct after opening |

REFERENCES

[1] EP-A-0 582 016 (International Business Machines Corporation)
[2] EP-A-0 582 018 (International Business Machines Corporation)
[3] FR-A-2 697 000 (Atomic Energy Commission—CEA)
[4] FR-A-2 697 003 (Atomic Energy Commission—CEA)
[5] FR-A-2 697 004 (Atomic Energy Commission—CEA)

What is claimed is:

1. A device for collectively transporting a plurality of flat objects individually confined in a given atmosphere having at least two modules each of flat form comprising a flat cell of small thickness opening onto a lateral face of said module, with each module being capable of receiving a single flat object and being closed by an independent door characterized in that each module comprises at least three positioning pins situated on opposite faces of the module in order to allow positioning of the modules with respect to one another when stacked in tandem and assembly means for interlocking each upper module to an adjacent lower module in each successive pair and in a complementary arrangement.

2. A device according to claim 1, wherein each module has at least one trasparent area facing the object.

3. A device according to claim 1, wherein at least one of the assembly means or positioning means perform an electrical ground connection in order to allow flow of electrostatic charges accumulated on the flat objects and in the modules to a grounded point.

4. A device according to claim 1, wherein each module has, on each side, at least one upper lug and at least one lower lug, these lugs being provided to allow stacking of the modules and bring into correspondence two lower or upper lugs of a module with a complementary upper or lower lug of an adjoining module; a mechanism housed in the lower lugs making it possible, on the one hand, to interlock the modules and, on the other hand, to place the modules flat on top of one another, at the time they are stacked.

5. A device according to claim 1, having a manipulation handle provided with the same assembly devices as those of the modules so as to be assembled on an upper surface of said device.

6. A device according to claim 1, wherein said independent door is removable and is provided with a toggle joint deformable under pressure exerted on the body of said door by a locking mechanism.

7. A device according to claim 6, wherein the body of the door of the modules is equipped with a former for interlocking with a complementary former provided inside a nose of the module.

8. A device according to claim 6, wherein a function of damping the flat object in each module is provided by a rigid positioning system including a wedge integral with the door, associated with two buffer stops and two elements which comprise a fork disposed at a rear of the module for preventing the flat object from moving in the module.

9. A method of transferring a flat object from a module of a device, according to claim 1, into a processing machine, with said device positioned on a platform mounted on a vertical indexer, comprising the steps of:

addressing a given module of the device after a vertical movement of this platform, connecting a selected module with the processing machine by means of a retractable collar, which has a movable jaw closed by a door, making it possible to close, in an airtight manner, the machine in a retracted position, and having a bellows and translation means, in order to be able to bring the movable jaw into contact with the module and achieve an airtight connection between the machine and module, and with the door of the module and the door of the movable jaw being associated and drawn back inside the movable jaw in order to form an airtight tunnel between the module and the machine, and using a robot to transfer an object; in one direction according to a translational movement, of the robot.

10. A method according to claim 9, wherein the transfer of a object is carried out at atmospheric pressure and takes place according to the following steps:

a) positioning of the device on a platform of the machine in a loading position;

b) adjusting pressure inside the device to ambient pressure inside the machine by means of gas supplies and ducts on the platform;

c) vertical indexing of the device in order to bring the module containing the object to be transferred opposite the movable jaw of the collar;

d) airtight linking between this module and the machine, by movement of the movable jaw of the collar by virtue of a translation mechanism integral with the collar;

e) purging dead volume between the door of the module and the door of the movable jaw;

f) connection of the door of the module to the door of the movable jaw by virtue of a mechanism belonging to the collar;

g) simultaneous opening of the two doors thus joined together in order to trap contamination at an interface and drawing back of these two connected doors into a space provided inside the movable jaw;

h) isolation as regards contamination of the cell of the module and of the machine; 1) transfer of the flat object by the robot through the airtight tunnel;

i) transfer of the flat object by the robot through the airtight tunnel;

j) simultaneous closure, by a mechanism in the collar, of the two doors held in contact;

k) unjoining of the two doors by action of the mechanism of the collar, which also provides for locking of the door of the module and its airtight closure;

l) withdrawal of the movable jaw by action of a transfer mechanism integral with the collar;

m) optionally, return to step c in order to transfer another object contained in another module, or advancing to a subsequent step if transfer operation is complete;

n) return the device to its loading position; and o) reconditioning of ambient atmosphere in the device by a purge cycle.

11. A method according to claim 9, wherein a check is made of the position of the module to be opened before a docking movement by virtue of vision systems equipping the movable jaw.

12. A method according to claim 9, wherein a position of the finger of the robot, or of the object at a time of its passage through the movable jaw, is checked by virtue of sensors, so as to carry out an operation of picking up or putting down of they object in the cell without generating any friction.

13. A method according to claim 9, wherein identification of the object occurs by virtue of a vision sensor installed in the collar.

14. A method according to claim 9, wherein a transfer is carried out under vacuum, the collar being counted inside a transfer airlock and the device being placed on the platform of the indexer belonging to the airlock, in a loading position, this method taking place according to the following steps:

a') positioning of the device on a platform of the machine in the loading position;

b') creating a vacuum in the device, carried out simultaneously with creating a vacuum in the airlock;

c') vertical indexing of the device in order to bring the module containing the object to be transferred opposite the movable jaw of the collar;

d') airtight linking between this module and the machine by movement of the movable jaw of the collar by virtue of a translation mechanism integral with the collar;

e') purging dead volume between the door of the module and the door of the movable jaw;

f') connection of the door of the module to the door of the movable jaw by virtue of a mechanism belonging to the collar, g') simultaneous opening of the two doors thus joined together in order to trap contamination between the joint door at the interface and drawing back of these two connected doors into a space provided inside the movable jaw;

h') transfer of the flat object by the robot through the airtight tunnel;

i') simultaneous closure, by mechanism in the collar, of the two doors held in contact;

j') unjoining of the two doors by action of the mechanism of the collar, which also provides for the locking of the door of the module and its airtight closure;

k') withdrawal of the movable jaw by action of the transfer mechanism integral with the collar;

l') optionally, return to step c in order to transfer another object contained in another module, or advancing to a subsequent step if transfer operation is complete;

m') return the device to its loading position; and n') reset to atmospheric pressure in the device, carried out by lowering it to a vacuum, a control system then providing by a simultaneous raising of pressure in the airlock and in the device by controlling a flow rate of nitrogen injected into the airlock and into the device by means of the ducts.

15. A device for transporting at least one flat object individually confined in a given atmosphere having at least one module of flat form for receiving a single flat object with each module comprising a flat cell of small thickness opening onto a lateral face of said module, each module being closed by an independent door, gas supply and return connectors for purging said device of gas with said gas supply and return connectors being situated in a rear part, on the opposite side of a face for accessing the flat objects, wherein each elementary module further comprises two plane ducting elements situated horizontally in its rear part and, communicating with an inside of the module so as to provide, respectively, the supply and the return of gas to said module, each ducting element being provided on its lower and upper face with a seal for achieving airtightness with the ducting elements of the other modules when the modules are stacked together and positioning means situated on opposite faces to allow positioning of the modules with respect to one another in a stacked arrangement.

16. A device according to claim 15, wherein each module comprises internal purging means, consisting of two perforated pipes having one blind end, and one end connected to the ducting elements.

17. A device according to claim 16, wherein the internal purging elements also serve as elements for supporting the object.

18. A device according to claim 15 having at least two modules and assembly means for interlocking an upper module to an adjacent lower module.

19. A device according to claim 18, wherein the ducting elements of the modules are terminated by self-sealing connectors.

20. A device according to claim 19, wherein each self-sealing connector comprises a filtering element, and a valve, guided by an end-plate mounted airtight by virtue of a first seal on each ducting element of the module, this end-plate being held under pressure by formers, the valve closing an opening of the connector in an airtight manner, when the connector is not connected, by virtue of pressure from a spring on a second seal, a lip seal making it possible to provide airtightness between the ducting elements of two adjoining modules.

* * * * *